US012794113B2

(12) United States Patent
Kim et al.

(10) Patent No.: US 12,794,113 B2
(45) Date of Patent: Nov. 10, 2026

(54) WIRELESS EARBUD COMPRISING ANTENNA

(71) Applicant: LG ELECTRONICS INC., Seoul (KR)

(72) Inventors: Duckyun Kim, Seoul (KR); Byongyol Lee, Seoul (KR); Sangheon Lee, Seoul (KR); Junpil Yun, Seoul (KR); Jeonghong Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 194 days.

(21) Appl. No.: 18/858,161

(22) PCT Filed: May 2, 2022

(86) PCT No.: PCT/KR2022/006224

§ 371 (c)(1),
(2) Date: Oct. 18, 2024

(87) PCT Pub. No.: WO2023/214593

PCT Pub. Date: Nov. 9, 2023

(65) Prior Publication Data

US 2025/0112358 A1 Apr. 3, 2025

(51) Int. Cl.
*H01Q 1/24* (2006.01)
*H01Q 5/20* (2015.01)
(Continued)

(52) U.S. Cl.
CPC ............... *H01Q 1/243* (2013.01); *H01Q 5/20* (2015.01); *H04R 1/10* (2013.01); *H05K 1/0243* (2013.01);
(Continued)

(58) Field of Classification Search
CPC ........ H01Q 1/243; H01Q 5/20; H01Q 1/2291; H01Q 1/273; H01Q 5/40; H01Q 7/00;
(Continued)

(56) References Cited

U.S. PATENT DOCUMENTS 9,774,083 B2 * 9/2017 Liu .......................... H01Q 1/38

FOREIGN PATENT DOCUMENTS

| | | |
|---|---|---|
| CN | 216291383 | 4/2022 |
| KR | 10-1303153 | 9/2013 |

(Continued)

OTHER PUBLICATIONS

PCT International Application No. PCT/KR2022/006224, International Search Report dated Feb. 2, 2023, 5 pages.

(Continued)

*Primary Examiner* — Ankur Jain
(74) *Attorney, Agent, or Firm* — LEE, HONG, DEGERMAN, KANG & WAIMEY

(57) ABSTRACT

An earbud according to an embodiment may comprise: a housing which includes a main body portion having a speaker port and a stalk extending from the main body portion; and an antenna structure which is disposed in the stalk and radiates a wireless signal to the outside of the earbud. The antenna structure may comprise: an antenna pattern which is connected to a power supply part and formed to have a first length so as to radiate the signal; and a ground pattern which is connected to a ground pattern of the PCB and formed to surround the antenna pattern on one side and the other side of the antenna pattern.

18 Claims, 14 Drawing Sheets

(51) Int. Cl.

| | |
|---|---|
| ***H04R 1/10*** | (2006.01) |
| ***H05K 1/02*** | (2006.01) |

(52) U.S. Cl.

CPC .................... *H04R 2420/07* (2013.01); *H05K 2201/10037* (2013.01); *H05K 2201/10098* (2013.01)

(58) Field of Classification Search

CPC .. H01Q 9/42; H01Q 1/38; H01Q 1/48; H01Q 5/307; H04R 1/10; H04R 2420/07; H04R 2225/51; H04R 1/1016; H04R 1/1025; H05K 1/0243; H05K 2201/10037; H05K 2201/10098

See application file for complete search history.

(56) References Cited

FOREIGN PATENT DOCUMENTS

| | | |
|---|---|---|
| KR | 10-2017-0097920 | 8/2017 |
| KR | 10-1995673 | 7/2019 |
| KR | 10-2021-0099970 | 8/2021 |
| WO | 2022052675 | 3/2022 |

OTHER PUBLICATIONS

European Patent Office Application Serial No. 22940834.9, Search Report dated May 20, 2025, 8 pages.

* cited by examiner (a)

(b)

(a)

(b)

(a)

(b)

(c)

(a)

(b)

(a)

WIRELESS EARBUD COMPRISING ANTENNA

CROSS-REFERENCE TO RELATED APPLICATION

This application is the National Stage filing under 35 U.S.C. 371 of International Application No. PCT/KR2022/006224, filed on May 2, 2022, the contents of which are hereby incorporated by reference herein its entirety.

TECHNICAL FIELD

The present disclosure relates to an electronic device and, more particularly, to an electronic device including an antenna. A specific embodiment of the present disclosure relates to a wireless earbud including an antenna and a control circuit.

BACKGROUND ART

Electronic devices, such as mobile phones, computers, and electronic accessories for electronic devices, may include a wireless circuit. For example, earbuds can be used as electronic devices that wirelessly communicate with mobile phones and other devices.

Small-sized electronic devices such as wireless earbuds may be configured to receive content reproduced from a mobile terminal, which is a host device, through a Bluetooth frequency band. The wireless earbud corresponds to a wearable electronic device that fits in the human ear.

Another problem may occur when embodying an antenna and a wireless communication circuit in the small-sized electronic device such as the wireless earbud. In this regard, an antenna may not operate effectively in such a manner that a wireless signal radiates into the main body of the wireless earbud worn into the human ear. Therefore, a problem arises in that desired wireless communication performance is difficult to achieve through wireless communication with a nearby electronic device.

The wireless earbud may be designed in such a manner as to receive a wireless signal through the Bluetooth frequency band which is the 2.4 GHz band. In order to receive the wireless signal, an antenna provided within the wireless earbud may be arranged on a protruding portion of the earbud, that is, a stalk portion of the earbud. In this regard, the stalk portion of the earbud increases in length when considering a resonance length of the antenna operating in the 2.4 GHz. The stalk portion of the earbud may be limited to a predetermined length or shorter from a design perspective that considers the use of the earbud. Therefore, according to the present disclosure, antenna design that can reduce the length of the antenna is required.

An operational bandwidth of the antenna included in the wireless earbud needs to be designed to be broader than an operational bandwidth of any other electronic device performing wireless communication through the Bluetooth frequency band. The reason for this is that an antenna resonating frequency changes due to the human body's movement when wearing the wireless earbud or due to the wireless earbud's movement within the ear canal.

In addition, wireless quality in the Bluetooth frequency band, which is the 2.4 GHz band, may deteriorate depending on environments surrounding the user who ears the wireless earbud. In a case where the wireless quality deteriorates in this manner, the reproduction of content, such as music, which is transferred to the wireless earbud through the host device, may be delayed or the content quality may deteriorate. In order to address these problems, there may also be a need for a wireless connection between the host device and the wireless earbud in a frequency other than the 2.4 GHz band.

DISCLOSURE OF INVENTION

Technical Problem

Objects of the present disclosure are to address the above-mentioned problems and other problems. One object of the present disclosure is to provide a wireless earbud including an antenna structure with a reduced antenna length.

Another object of the present disclosure is to enable an antenna structure included in a wireless earbud to operate in a plurality of frequency bands.

A further object of the present disclosure is to increase an operational bandwidth of an antenna included in a wireless earbud.

Another object of the present disclosure is to stably receive a wireless signal even if an antenna resonating frequency changes when wearing a wireless earbud.

Still another object of the present disclosure is to minimize a change in antenna performance due to a small antenna arrangement space formed within a mechanism of the wireless earbud.

Yet another object of the present disclosure is to minimize a change in antenna performance due to a small antenna arrangement space formed within a mechanism of the wireless earbud.

Solution to Problem

In order to accomplish the above-mentioned objects or other objects, according to one aspect of the present disclosure, there is provided an earbud including: a housing having a main body portion in which a speaker port is provided and a stalk extending from the main body portion; and an antenna structure arranged within the stalk and radiating a wireless signal out of the earbud. In the earbud, the antenna structure includes an antenna pattern formed to a first length in such a manner as to be connected to a feeder and to radiate the signal; and a ground pattern formed in such a manner as to be connected to a ground pattern on the PCB and to surround the antenna pattern on one side and the other side of the antenna pattern.

In an embodiment, the earbud includes a printed circuit board (PCB) configured to be electrically connected to the antenna structure. In the earbud, the antenna structure includes a feeder configured to be connected to a signal pattern on the PCB and to transfer a signal.

In an embodiment, in the earbud, the ground pattern may include a first ground pattern formed in such a manner as to be connected to the ground pattern on the PCB and to have a second length on one side of the antenna pattern. In the earbud, the ground pattern may include a second ground pattern formed in such a manner as to be connected to the first ground pattern and to have a third length. In the earbud, the ground pattern may include a third ground pattern formed in such a manner as to be connected to the second ground pattern and to have a fourth length on the other side of the antenna pattern. In the earbud, at least one of the first and third ground patterns may be formed in such a manner that a width thereof is greater than a width of the antenna pattern.

In an embodiment, in the earbud, the second ground pattern may be formed perpendicularly to the first ground pattern and may be arranged in parallel to the feeder. In the earbud, the third ground pattern may be formed perpendicularly to the second ground pattern and may be arranged in parallel to the antenna pattern.

In an embodiment, in the earbud, the third ground pattern may form an overlapping region that overlaps with the antenna pattern over a predetermined length along one axial direction on the other side of the antenna pattern.

In an embodiment, in the earbud, the second ground pattern may be formed in such a manner that a length thereof is greater than a length of the feeder along the other axial direction perpendicular to the one axial direction.

In an embodiment, in the earbud, the antenna pattern may be formed on a first flexible printed circuit board (FPCB) that is connected to a first surface of the PCB.

In an embodiment, in the earbud, the ground pattern may be formed on a second FPCB that is connected to a second surface facing a first surface of the PCB. In the earbud, the second FPCB may include a first region attached to the second surface of the PCB. In the earbud, the second FPCB may include a second region formed to surround the antenna pattern and forming a radiation region by being coupling-combined with the antenna pattern.

In an embodiment, the earbud may further include a battery attached to the second FPCB and arranged in a space between the first FPCB on which the antenna pattern is formed and the second FPCB, the first ground pattern being formed on the second FPCB.

In an embodiment, in the earbud, the first ground pattern may include a first sub-pattern arranged to be separated by a first gap from the third ground pattern. In the earbud, the first ground pattern may include a second sub-pattern extending downward from an end portion of the first sub-pattern and arranged to be separated by a second gap, which is narrower than the first gap, from the third ground pattern.

In an embodiment, the earbud may further include a microphone module attached to the second sub-pattern and arranged in the space between the first FPCB on which the antenna pattern is formed and the second FPCB.

In an embodiment, in the earbud, a first surface of the battery and a second surface of the microphone module may be attached to the second FPCB. In the earbud, a second surface of the battery and the second surface of the microphone module may form the first ground pattern.

In an embodiment, in the earbud, a third gap between the second surface of the battery and the third ground pattern and a fourth gap between the second surface of the microphone module and the third ground pattern may be formed in a manner that is equal to or less than a predetermined gap.

In an embodiment, in the earbud, the antenna structure may operate as a radiator in the 2.4 GHz band. In the earbud, the antenna structure may operate as a radiator in the 5 GHz band. In the earbud, the antenna structure may be formed to fall within a predetermined range of lengths where the median corresponds to half a wavelength in the 2.4 GHz band by the total length resulting from the sum of the first length of the antenna pattern, the second length of the first ground pattern, a connection length of the second ground pattern, and the third length of the third ground pattern.

In an embodiment, in the earbud, the antenna structure may operate as a radiator in the 2.4 GHz band. In the earbud, the antenna structure may operate as a radiator in the 5 GHz band. In the earbud, the overlapping regions of the antenna pattern and the third ground pattern 233 may be formed in such a manner that lengths thereof range from 1 mm to 5 mm. In the earbud, the antenna pattern may be formed in such a manner that the first length thereof is 1.0 mm or greater, the first ground pattern may be formed in such a manner that the second length thereof is 3.0 mm or greater, the second ground pattern may be formed in such a manner that the connection length thereof is 0.5 mm or greater, and the third ground pattern may be formed in such a manner that the third length thereof is 1.0 mm or greater.

In an embodiment, in the earbud, the overlapping region may be formed in such a manner that a length thereof falls within a predetermined range of lengths where the median is 1.5 mm. In the earbud, the antenna pattern may be formed in such a manner that the first length thereof falls within a predetermined range of lengths where the median is 7.4 mm., the first ground pattern may be formed in such a manner that the second length thereof falls within a predetermined range of lengths where the median is 13.5 mm, the second ground pattern may be formed in such a manner that the connection length thereof falls within a predetermined range of lengths where the median is 4.5 mm, and the third ground pattern may be formed in such a manner that the third length thereof falls within a predetermined range of lengths where the median is 8.6 mm.

In an embodiment, in the earbud, the overlapping region may be formed in such a manner that a length thereof falls within a predetermined range of lengths where the median is 4.0 mm. In the earbud, the antenna pattern may be formed in such a manner that the first length thereof falls within a predetermined range of lengths where the median is 6.0 mm, the first ground pattern may be formed in such a manner that the second length thereof falls within a predetermined range of lengths where the median is 7.0 mm, the second ground pattern may be formed in such a manner that the connection length thereof falls within a predetermined range of lengths where the median is 4.5 mm, and the third ground pattern may be formed in such a manner that the third length thereof falls within a predetermined range of lengths where the margin is 6.0 mm.

According to another aspect of the present disclosure, there is provided an electronic device that receives a wireless signal containing content, the electronic device including: a dielectric housing including a main body portion in which a port is provided and a protruding portion extending from the main body portion; and an antenna module arranged within the protruding portion and radiating a wireless signal out of the electronic device. In the electronic device, the antenna module includes a feeder configured to be connected to a signal pattern on a circuit structure arranged within the main body portion and to transfer a signal; a radiator pattern formed to a first length in such a manner as to be connected to the feeder and to radiate the signal; and a ground pattern formed in such a manner as to be connected to a ground pattern on the circuit structure and to surround the radiator pattern on one side and the other side of the radiator pattern.

In an embodiment, in the electronic device, the circuit structure may be embodied as a printed circuit board (PCB) configured to be electrically connected to the antenna module. In the electronic device, the ground pattern may include: a first ground pattern formed in such a manner as to be connected to a ground pattern on the PCB and to have a second length on one side of the radiator pattern. In the electronic device, the ground pattern may include a second ground pattern formed in such a manner as to be connected to the first ground pattern and to have a third length. In the electronic device, the ground pattern may include a third ground pattern formed in such a manner as to be connected to the second ground pattern and to have the fourth length on the other side of the radiator pattern.

In an embodiment, in the electronic device, the second ground pattern may be formed perpendicularly to the first ground pattern and may be arranged in parallel to the feeder. In the electronic device, the third ground pattern may be formed perpendicularly to the second ground pattern and may be arranged in parallel to the radiator pattern. In the electronic device, the third ground pattern may form an overlapping region that overlaps with the radiator pattern over a predetermined length along one axial direction on the other side of the radiator pattern.

In an embodiment, the electronic device may further include an RF circuit operatively coupled to the antenna module and transferring a wireless signal in a specific frequency band to the antenna module. The electronic device may further include a processor configured to be operatively coupled to the RF circuit and to control the RF circuit.

In an embodiment, in the electronic device, the processor may control the RF circuit in such a manner that a first wireless signal in a first frequency band is received through the antenna module. In the electronic device, when signal quality of the first wireless signal is determined as being at or below a threshold value, the processor may control the RF circuit in such a manner that a second wireless signal in a second frequency band broader than the first frequency band is received from a host device through the antenna module.

Advantageous Effects of Invention

Technical effects of a wireless earbud including this antenna structure are described as follows.

According to the present disclosure, the antenna structure with a reduced antenna length is arranged within a housing of the wireless earbud, thereby enabling the reception of a wireless signal containing content.

According to the present disclosure, the antenna structure operates in a plurality of frequency bands in an electronic device such as the wireless earbud, thereby enabling the stable reception of the wireless signal even when surrounding environments change.

According to the present disclosure, a ground pattern is formed to surround an antenna pattern, thereby enabling an increase in effective volume of an antenna and thus an improvement in an antenna bandwidth attribute.

According to the present disclosure, the ground pattern is formed to surround the antenna pattern, thereby enabling the increase in the effective volume of the antenna and thus an improvement in an antenna efficiency attribute.

According to the present disclosure, the antenna structure can be configured to operate in broadband in the electronic device such as the wireless earbud.

According to the present disclosure, the wireless signal can be stably received even when an antenna resonating frequency changes due to the human body's movement when wearing the wireless earbud or due to the wireless earbud's movement within the ear canal.

According to the present disclosure, a change in antenna performance due to a small antenna arrangement space formed within a mechanism of the wireless earbud can be minimized, thereby enabling stable maintenance of wireless communication performance.

Further scope of applicability of the present disclosure will become apparent from the foregoing detailed description. It should be understood, however, that the detailed description and specific examples, such as the preferred embodiment of the invention, are given by way of illustration only, since various changes and modifications within the idea and scope of the invention will be apparent to those skilled in the art.

MODE FOR THE INVENTION

Figure 1:
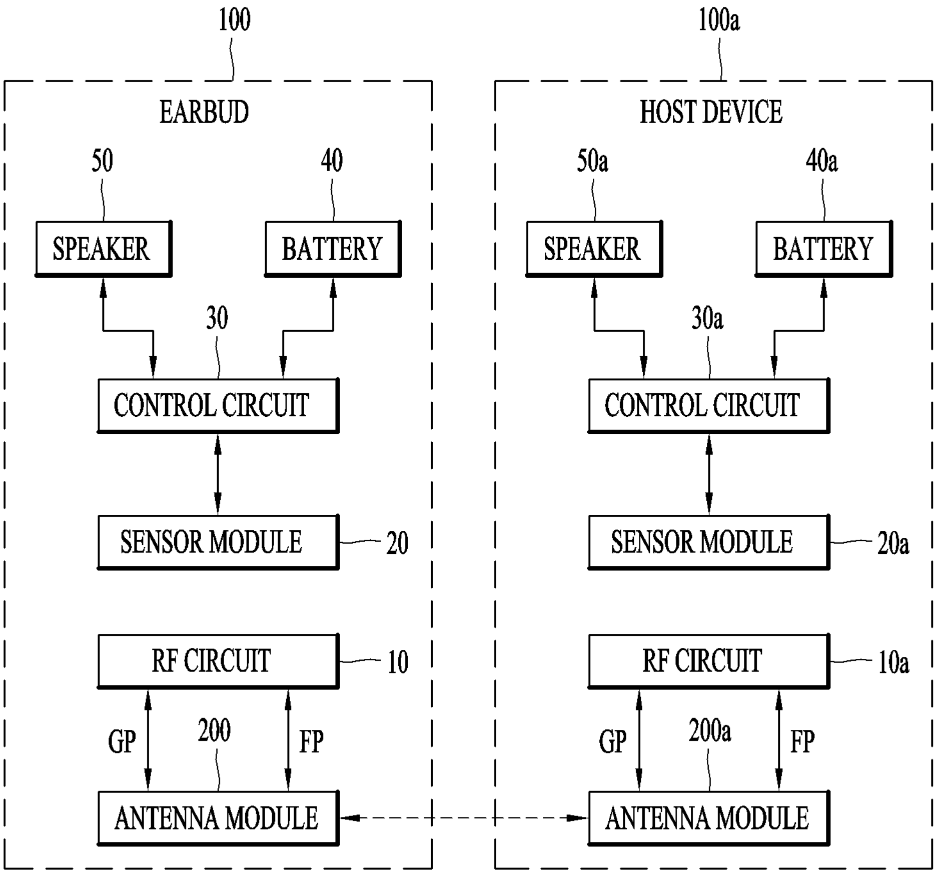
FIG. 1 is a block diagram illustrating a configuration of an exemplary system that includes an electronic device wirelessly communicating with a wearable electronic device, such as a wireless earbud, according to the present disclosure.

Description will now be given in detail according to exemplary implementations disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

An electronic device described in the present specification may be a wearable device. Wireless wearable electronic devices, such as wireless earbuds, may communicate with a host device and may communicate with each other. In this type of arrangement, arbitrarily chosen suitable types of host electronic devices and wearable wireless electronic devices may be used. In the present specification, as an example, the use of wireless hosts, such as cellular telephones, computers, or wristwatches, may be described depending on the context. In addition, an arbitrarily chosen suitable wearable wireless electronic device may wirelessly communicate with the wireless host. The use of the wireless earbud for communication with the wireless host is only exemplary.

The wireless electronic device as a host may wirelessly communicate with an accessory device, such as the earbud. In this regard, FIG. 1 is a block diagram illustrating a configuration of an exemplary system that includes an electronic device wirelessly communicating with a wearable electronic device, such as a wireless earbud, according to the present disclosure.

Referring to FIG. 1, a host electronic device 100*a* may be a mobile terminal capable of performing wireless communication or a wearable device that is different from the wireless earbud, but is not limited thereto. The host electronic device 100*a* may be embodied as an arbitrary electronic device capable of performing wireless communication with the wireless earbud, or for example, as any one of the following: a computer, a laptop computer, a content reproduction device on a home network, or a vehicular communication device.

A wireless earbud 100 may be configured to include various constituent elements. In this regard, the wireless earbud 100 may be configured to include an antenna module 200, an RF circuit 10, and a sensor module 20. The wireless earbud 100 may be configured to further include a control circuit 30, a battery 40, and a speaker 50. The host electronic device 100*a* may be configured to include an antenna module 200*a* and an RF circuit 10(*a*) in order to perform wireless communication with the earbud 100. The host electronic device 100*a* may be configured to further include the sensor module 20, the control circuit 30, the battery 40, and the speaker 50, but is not limited thereto. The host electronic device 100*a* may be configured to include more constituent elements than the earbud 100.

The antenna module 200 may be configured to receive a wireless signal containing voice content from the host electronic device 100*a*. The antenna module 200 may be configured to receive a wireless signal in the Bluetooth band, for example, in a band ranging from 2.4 to 2.488 GHz, from the host electronic device 100*a*. In this regard, a wireless communication link between the host electronic device 100*a* and the earbud 100 is not limited to Bluetooth communication. An arbitrary wireless communication link, for example, a short-range wireless communication link in a frequency band of 2.4 GHz, 5 GHz, or the like, that is capable of supporting short-range wireless communication between the host electronic device 100*a* and the earbud 100 may be used. A wireless communication link in a mobile communication frequency band that supports IoT wireless communication, or a wireless communication link in a millimeter-wave band may also be used according to application.

In addition, when a user's input is applied using an operation button provided on the earbud 100, a control command may be transferred to the host electronic device 100*a* through the antenna module 200 in such a manner as to control reproduction, sound volume, or the like of the voice content. The antenna module 200*a* of the host electronic device 100*a* may receive, in the Bluetooth band, a wireless signal containing the control command.

The antenna module 200 may be operatively coupled to the RF circuit 10. The antenna module 200 may be connected to a signal pattern on the RF circuit 10 through a feeding portion (FP). The antenna module 200 may be connected to a ground pattern on the RF circuit 10 through a ground connection portion GP. The RF circuit 10 may be configured to amplify, filter, and process a signal that is transmitted through the antenna module 200 and a signal that is received therethrough.

The sensor module 20 may be configured to include at least one sensor. The sensor module 20 may be configured to include a proximity capable of sensing the user's motion and sensing whether or not the user is nearby, a touch sensor capable of sensing the user's input, a pressure sensor, and the like, but is not limited to these sensors. The sensor module 20 may also further include an acceleration sensor, a gyro sensor, and the like.

The control circuit 30 may be operatively coupled to the sensor module 20, the battery 40, and the speaker 50. The control circuit 30 may be configured to control the respective operations of the sensor module 20, the battery 40, and the speaker 50.

The battery 40 may be configured to supply power to various electronic components arranged within the earbud 100. The battery 40 may be configured to store power when receiving it from a charger and to supply it to various electronic components. The speaker 50 may be configured to reproduce voice content received from the host electronic device 100*a*.

The earbud 100 according to the present disclosure may be configured in such a manner that it is formed in a mechanism structure with the form of a housing and that a port, such as a speaker port, is formed on the outside thereof. In this regard, the antenna module of the earbud 100, which is capable of receiving or transmitting a wireless sign, may be arranged within a housing. In this regard, FIGS. 2 and 3 are perspective views illustrating the earbud according to the present disclosure, when viewed from the front and when viewed from the rear, respectively.

Figure 2:
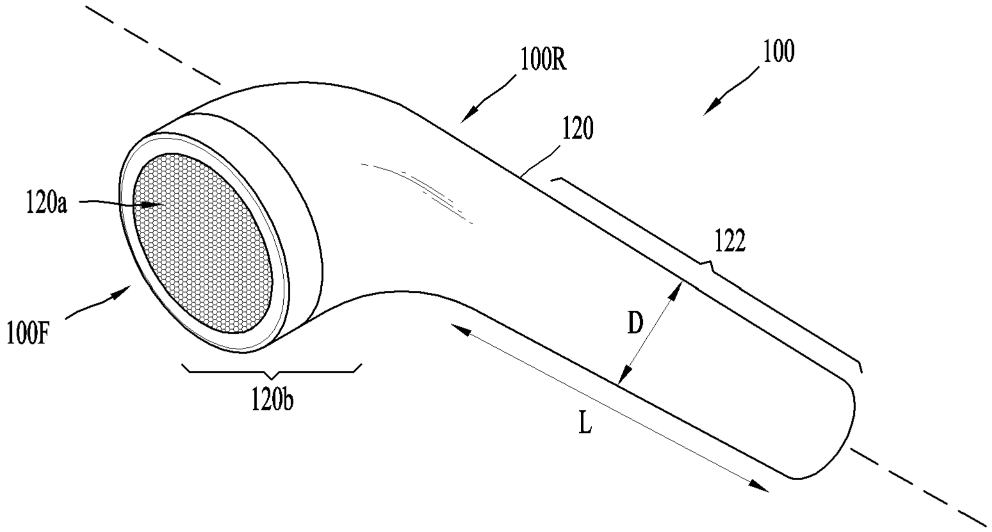
FIGS. 2 and 3 are perspective views illustrating the earbud according to the present disclosure, when viewed from the front and when viewed from the rear, respectively.
Figure 3:
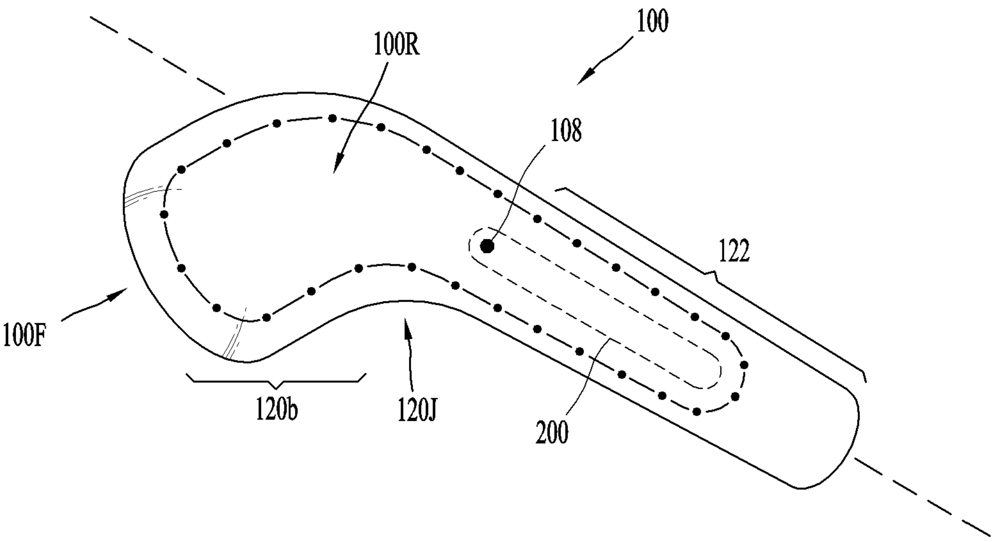

Referring to FIG. 2, which is the perspective view illustrating the earbud, when viewed from the front, the earbud 100 may be divided into a front surface 100F and a rear surface 100R with one axis in between. A housing 120 may include a main body portion 120*b* in which a speaker port 120*a* is formed. The speaker port 120*a* may be formed to face a front surface of the earbud 100. An elongated protruding portion, such as a stalk portion 122 of the housing 120, may extend outward from a main housing portion 120*b*. The stalk portion 122 may be formed as an elongated protruding portion having a predetermined L and diameter D.

The main body portion 120*b* may have a shape that appropriately fits in the user's ear. A speaker 20 may be mounted on the main body portion 120*b* and may align with the speaker port 120*a*. The speaker 20 may be used to propagate sound into the user's ear. The speaker port 120*a* may be formed from one or more openings in the housing 120. One or more plastic or metal mesh layers may be interposed between the housing 20 and the opening(s) 120.

The housing 120 may be formed of metal, plastic, a carbon fiber composite material, other fiber composite materials, glass, ceramics, other materials, or a combination of these. An elongated shape of the stalk 122 enables the user to grip the earbud 100 in his/her ear with his/her hand. The stalk 122 may extend from the main body portion 120*b* at the rear side 100R of the housing 120 and may extend along a stalk axis 120 in the lengthwise direction. According to the application, the stalk 122 may also be formed in a predetermined-type curved shape other than a straight-line shape.

FIG. 3 is a perspective view illustrating the earbud 100 in FIG. 2, when viewed from the rear. As illustrated in FIG. 3, an antenna 200 may have an elongated shape that extends along an axis in parallel to a length of the stalk 122. The antenna 200 may be formed to run from a feeder 108 up to a lower region of the stalk 122, but is not limited to this configuration.

Referring to FIGS. 1 to 3, the antenna 200 may overlap with structures such as a battery 26 and other conductive constituent elements that are positioned in an internal region 124 of the housing 120. These structures may be formed of a conductive material that tends to block the antenna 200.

The antenna feeder 108 may be positioned at a junction portion 12J of the housing 120 located between the main body 120*b* and the stalk 122 instead of at a location that overlaps with a region 124 of the main body 120*b*. Arranging the antenna feeder at a second position 108 rather than a first position 108' may contribute to minimizing unnecessary radiation, occurring on a different ground plane, and power consumption. The first position 108' is the same as that of the main body portion 120*b*, and the second position 108 is the same as a junction point 120J. Minimizing this unnecessary radiation and power consumption can reduce consumption of power in a battery and improve antenna efficiency.

The antenna 200 may be formed as a metal pattern or a metal trace that is patterned on a printed circuit board (PCB). The PCB may be configured as a flexible printed circuit board (FPCB) (for example, a printed circuit formed as a sheet of a polyimide board material or another polymer board material).

A configured is described below in which wireless communication with an electronic device outside the earbud is performed through a radiator arranged within the earbud according to the present disclosure. The electronic device outside the earbud may correspond to the host electronic device 100*a* in FIG. 1 and the earbud may correspond to the earbud 100 in FIG. 1. The earbud 100 may perform wireless communication with the host electronic device 100*a* through the antenna module 200. The earbud corresponds to a type of electronic device that receives content through wireless communication with the host electronic host. The earbud may be referred to as a true wireless stereo (TWS). A radiator structure arranged within the earbud that performs wireless communication with the host electronic device is described in detail.

Figure 4:
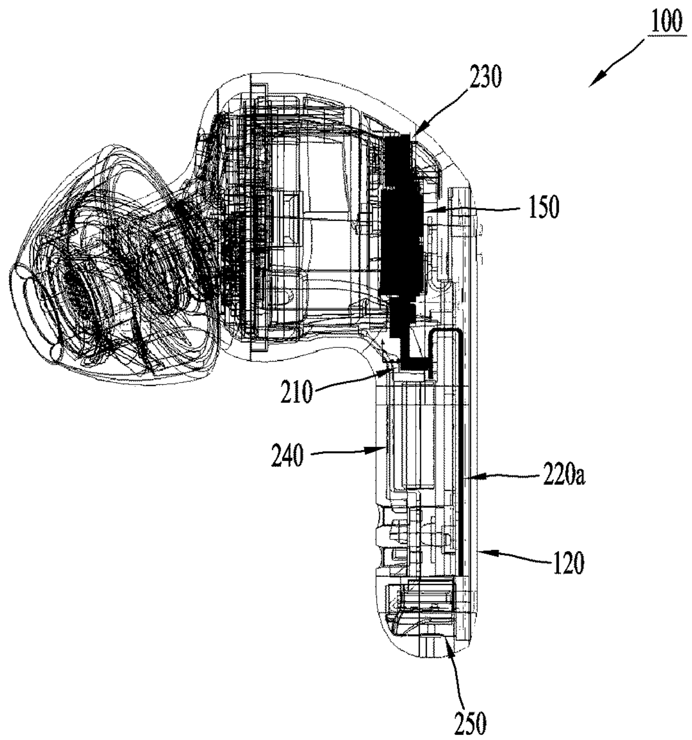
FIGS. 4 and 5 are views illustrating radiation structures, respectively, that are formed within the earbuds in embodiments.
Figure 4:
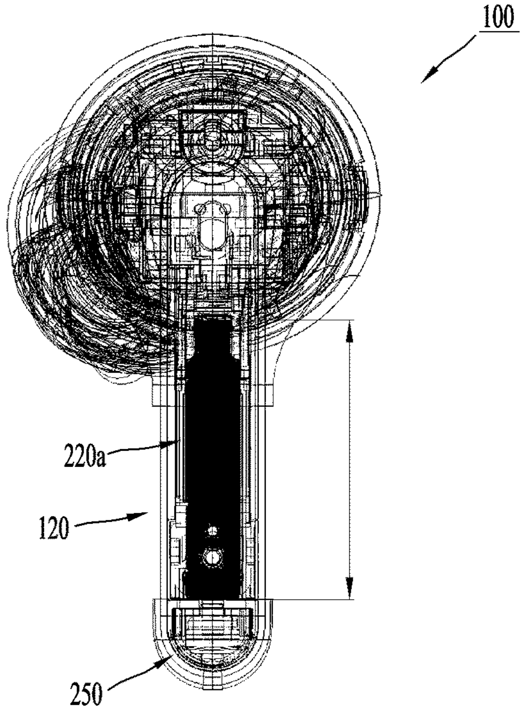
Figure 5:
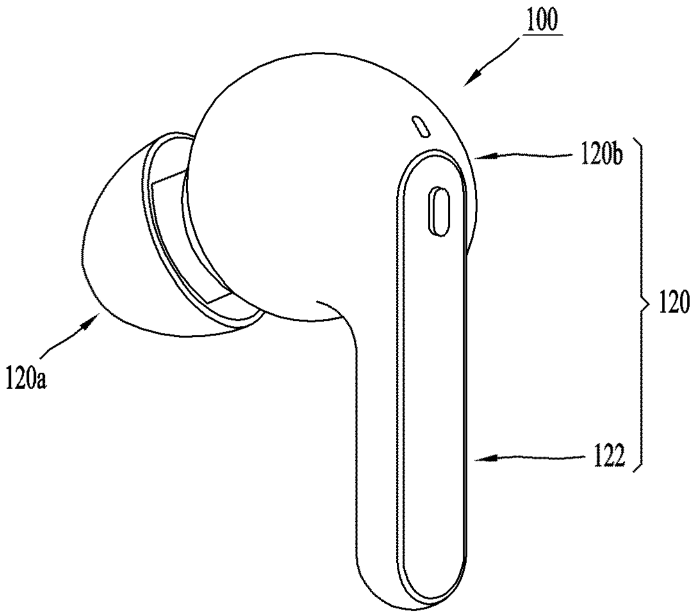
Figure 5:
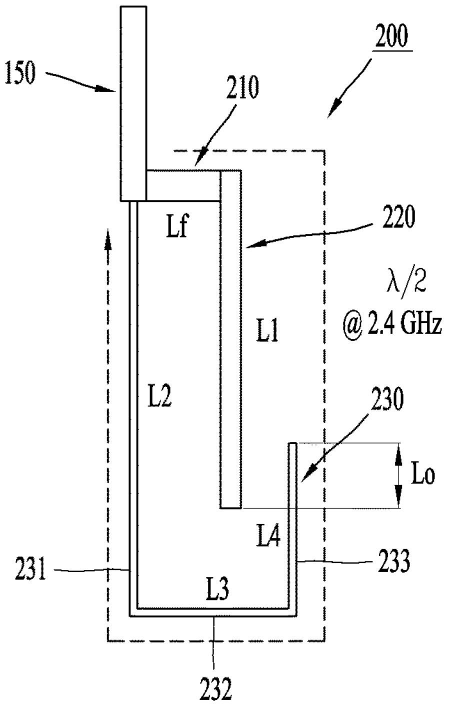

In this regard, FIGS. 4 and 5 illustrate the radiator structures, respectively, that are formed within the earbuds in embodiments. FIGS. 4(*a*) and 4(*b*) are side and front views, respectively, illustrating that the antenna is arranged within an external structure of the earbud.

Referring to FIG. 4, an antenna structure 200*a* may be formed within the housing 120 of the earbud 100. The antenna structure 200*a* may include a feeder 210, an antenna pattern 220*a*, and a ground 230. The earbud 100 may further include a battery 240 and a microphone module 250. The feeder 210 is configured to be connected to a signal pattern on a PCB 150 and to transfer a signal to the antenna pattern 220*a*. The antenna pattern 220*a* may be formed to be connected to the feeder 210 and to have such a predetermined length that a signal radiates. The ground 230 may be configured to be connected to a ground pattern on the PCB 150. The ground 230 may be configured to be connected to the housing 120 of the earbud 100.

The antenna structure 200*a* employed in the earbud 100 may be embodied as an inverted-F antenna. In this regard, a resonating phenomenon occurs due to the antenna pattern 220*a*. For this reason, the antenna pattern 220*a* may be referred to as a resonating element arm. As an example, the antenna pattern 220*a* may be embodied in such a manner as to have a predetermined range length at one-fourth of a wavelength in the 2.4 GHz band.

However, it is necessary to reduce the length of the stalk 122, which corresponds to a bar portion, in order to improve the wearability of the earbud 100. In this regard, when reducing a portion of the earbud 100 that corresponds to the stalk 122, there may occur a shortage in antenna resonance length and a reduction in performance in the 2.4 GHz band. In addition, in a case where the earbud 100 performs wireless communication through a Bluetooth interface at a public place heavily populated with people, wireless performance may decrease. To this end, the antenna structure of the earbud 100 also needs to operate at a frequency band other than the 2.4 GHz band, for example, at a UWB band. To this end, the antenna structure of the earbud 100 needs to be configured in such a manner that multi-resonance occurs so that the antenna structure also resonates in a frequency band other than the 2.4 GHz band.

Figure 6:
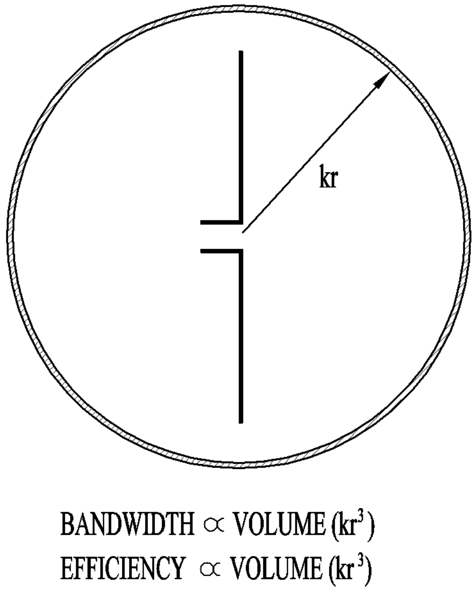
FIG. 6 is a set of conceptual views: one illustrating an antenna attribute that varies with effective volume of an antenna, another illustrating a resonance length of a dipole antenna, and a third illustrating a resonance length of an antenna with a coupled loop structure proposed in the present specification.
Figure 6:
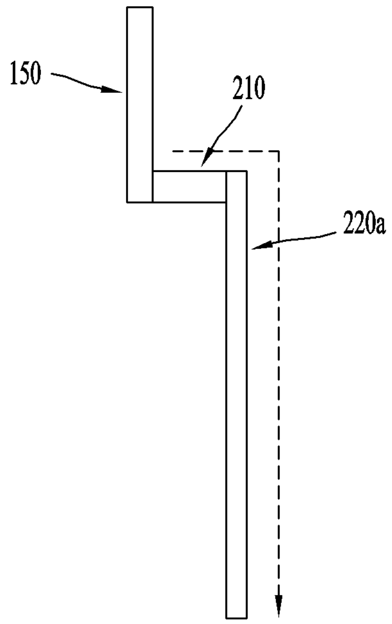
Figure 6:
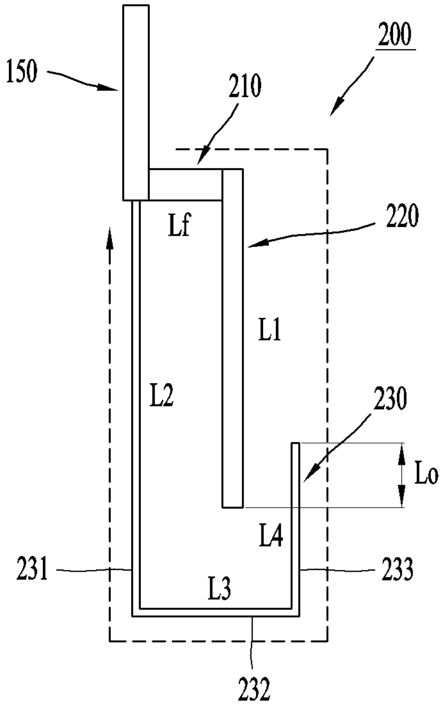
Figure 7:
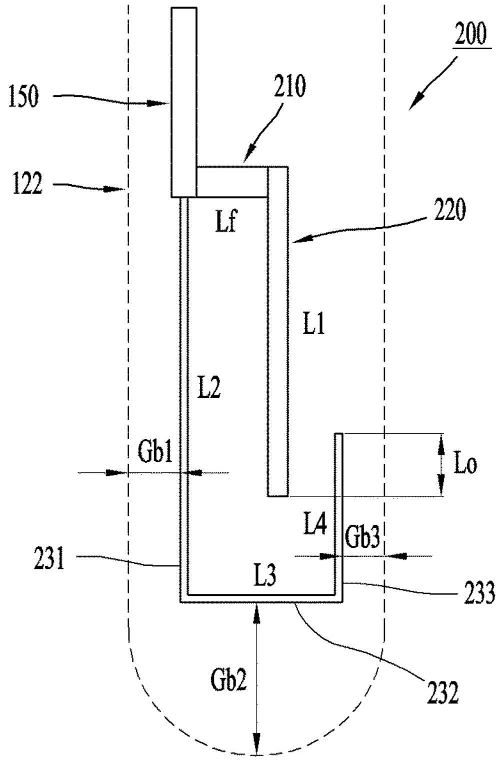
FIG. 7 is a set of side and front views illustrating an antenna structure according to the present disclosure.
Figure 7:
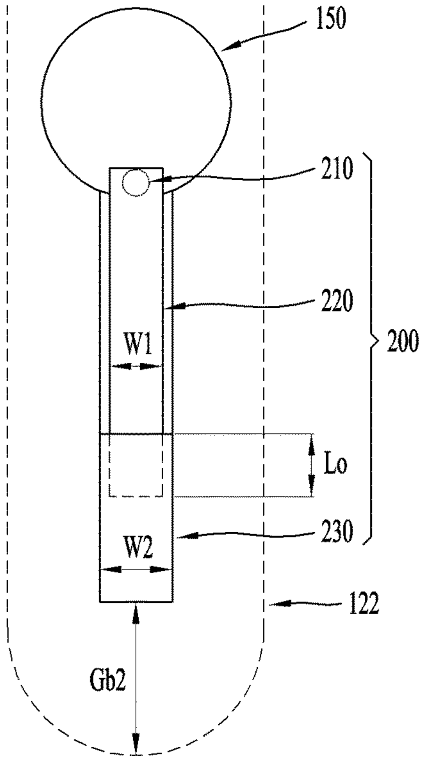

FIG. 5 illustrates an antenna structure that features a coupled loop structure capable of being formed within the earbud. In this regard, FIG. 6 is a set of conceptual views: one illustrating an antenna attribute that varies with effective volume of an antenna, another illustrating a resonance length of a dipole antenna, and a third illustrating a resonance length of the antenna with the coupled loop structure proposed in the present specification. FIG. 7 is a set of side and front views illustrating an antenna structure according to the present disclosure.

Referring to FIG. 5, an antenna pattern 220 of the proposed antenna structure may be formed as a loop antenna configured to achieve coupling with a ground pattern 230 along one axial direction. An antenna structure 200 may be configured to include the feeder 210, the antenna pattern 220, and the ground pattern 230.

Therefore, the antenna structure proposed in the present specification is an antenna structure for improving the antenna performance of a bar-type wireless earbud. In this regard, in a case where a dipole antenna, a monopole antenna, and an inverted-F antenna do not satisfy antenna performance in terms of bandwidth and efficiency, additional improvement in their antenna performance is not easy. When a length of a bar portion of the bar-type wireless earbud is reduced, issues such as a shortage of resonance length and a reduction in antenna performance may occur in the 2.4 GHz band. In addition, it is not easy for these antennas to achieve multi-resonance and thus to provide wireless communication services in frequency bands other than the Bluetooth band.

The antenna structure proposed in the present specification is a loop-structure antenna to which a coupling technique applies. The loop-structure antenna, as described above, may be configured to include the antenna pattern 220, the ground pattern 230, and the feeder 210. The antenna structure 200 may resonate at approximately half a wavelength from the feeder 210 up to a connection portion of the ground pattern 230. However, in the antenna structure 200, it is possible to adjust an antenna resonance length using an overlapping region that corresponds to an overlapping length Lo between the antenna pattern 220 and the ground pattern 230.

Therefore, in the antenna structure 200 proposed in FIG. 5, using the entire bar portion of the earbud can improve bandwidth and efficiency much more than in the cases of a dipole, a monopole, and an inverted-F antenna. When a length of the bar portion of the earbud is reduced, it is also possible for the antenna structure 200 to achieve a resonance length and a performance improvement in the 2.4 GHz band. In addition, it is possible for the antenna structure 200 to achieve multi-resonance and thus to provide an additional wireless communication service other than in the case of Bluetooth communication.

In this regard, the difference of the antenna structure 200 in FIG. 5 is that the ground pattern 230 is utilized as an antenna. In this regard, in the antenna structure in FIG. 4, the ground 230 may be formed, and a flexible printed circuit board (FPCB) may be arranged in the same region as the ground 230. The FPCB may be a ground structure unnecessary for applications such as microphone and power line connections in terms of an antenna. Therefore, a ground structure of the FPCB may cause a reduction in antenna performance and the occurrence of parasite resonance. The antenna structure in FIG. 4 is a structure for minimizing a region for the ground 230, and may reduce an effect on the antenna pattern 220*a*.

The antenna structure 200 in FIG. 5 has structural and technical features in that a ground structure, which may cause a reduction in antenna performance or the occurrence of parasitic resonance, is utilized as a separate ground pattern 230. The antenna structure 200 makes it possible to overall improve antenna performance and reduce size by utilizing the ground structure, which may otherwise cause a reduction in antenna performance and the occurrence of parasitic resonance, as a ground pattern. In the antenna structure 200 in FIG. 5, microphone phone and power lines may also be connected to the FPCB for embodying the ground pattern 230. A ground pattern on the FPCB, to which the microphone and power line are connected, is utilized as an antenna, and thus it is possible for the antenna structure 200 in FIG. 5 to achieve an improvement in antenna performance and a reduction in size.

Referring to FIG. 6(*a*), an antenna bandwidth attribute and an antenna efficiency attribute may be determined according to the effective volume in which an antenna is formed. The effective volume may be determined by a distance r over which a near field of the antenna is formed. The effective volume of the antenna that varies with the distance r may be expressed as kr3 in terms of an electromagnetic unit. Therefore, the antenna bandwidth attribute and the antenna efficiency attribute may be proportional to the effective volume of the antenna. The resonance length of the antenna is inversely proportional to a length L of the antenna. This principle is not limited to a dipole antenna in FIG. 7(*a*) and also applies to the monopole antenna, the inverted-F antenna, and the antenna structure 200 in FIG. 7(*b*). Accordingly, when an antenna is embodied within a limited space in the stalk portion of the earbud, antenna performance can be reduced.

Referring to FIG. 6(*b*), the dipole antenna may be configured to include the PCB 150, the feeder 210, and the antenna pattern 220*a*. A resonance length of the dipole antenna may be determined as the sum of a length of the feeder 210 and a length of the antenna pattern 220*a*. In this regard, the antenna is not limited to the dipole antenna and may be replaced with the monopole antenna or the inverted-F antenna.

Referring to FIG. 6(*c*), the antenna structure 200 may be configured to include the feeder 210, the antenna pattern 220, and the ground pattern 230. A resonance length of the antenna structure 200 may be determined as the sum of the length of the feeder 210, the length of the antenna pattern 220, and a length of the ground pattern 230. The antenna pattern 220 and the ground pattern 230 may be arranged to have their respective overlapping lengths. In this regard, the resonance length of the antenna structure may be determined by a value obtained by subtracting the overlapping length of each of the antenna pattern 220 and the ground pattern 230 from the sum of the length of the feeder 210, the length of the antenna pattern 220, and the length of the ground pattern 230.

FIG. 7(*a*) is a side view illustrating that the antenna structure 200 is arranged on the stalk 122 of the wireless earbud, that is, on the bar portion thereof, the ground pattern 230 formed to surround the antenna pattern 220 being formed on the antenna structure 200. FIG. 7(*b*) is a front view illustrating that the antenna structure 200 is arranged on the stalk 122 of the wireless earbud, that is, on the bar portion thereof, the ground pattern 230 formed to surround the antenna pattern 220 being formed on the antenna structure 200.

Referring to FIG. 7, the antenna structure 200 may be configured to include the feeder 210, the antenna pattern 220, and the ground pattern 230. Referring to FIG. 7(*a*), a first ground pattern 231 may be formed to be separated by a first gap Gb1 from one side of the stalk 122. A second ground pattern 232 may be formed to be separated by a second gap Gb2 from a lower end of the stalk 122. A third ground pattern 233 may be formed to be separated by a third gap Gb3 from the lower end of the stalk 122. In this regard, the first gap Gb1 and the second gap Gb3 may be set to a predetermined gap or wider, considering the minimum frequency within an operating band of the antenna structure 200. In this regard, the first ground pattern 231 is formed in such a manner that a length L2 thereof is shorter than a length L4 of the third ground pattern 233. Accordingly, the first gap Gb1 may be formed to be wider than the third gap Gb3. The second gap Gb2 may be set to the minimum gap in order to minimize the length of the stalk 122 of the earbud. The second gap Gb2 may also be formed to a predetermined gap or wider, considering the minimum frequency within the operating band of the antenna structure 200.

Referring to FIG. 7(*b*), a width of the antenna pattern 220 and a width of the ground pattern 230 may be set to be the same, or a difference in width between the antenna pattern 220 and the ground pattern 230 may be set to fall within a predetermined range of widths. As another example, the ground pattern 230 may be formed in such a manner that a width thereof is greater than a width of the antenna pattern 220, considering a fringing field on one side and the other side of the antenna pattern 220.

Since the ground pattern 230 is formed in such a manner that a width W2 thereof is greater than a width W1 of the antenna pattern 220, an electric field concentrates within the antenna structure 200 much more than in a case where the ground pattern 230 is formed to have the same width as the antenna pattern 220. In addition, since the ground pattern 230 is formed in such a manner that the width W2 thereof is greater than the width W1 of the antenna pattern 220, the freedom of antenna design can increase, and impedance matching can be achieved in a wider broadband. Therefore, since the ground pattern 230 is formed in such a manner that the width W2 thereof is greater than the width W1 of the antenna pattern 220, the antenna efficiency attribute and the bandwidth attribute can be improved.

The first ground pattern 231 and the third ground pattern 233 may be formed in such a manner that the widths W2 thereof are greater than the width W1 of the antenna pattern 220. As another example, the first ground pattern 231 and the third ground pattern 233 may be formed in such a manner that at least one of the widths W2 thereof is greater than the width W1 of the antenna pattern 220. In this regard, the third ground pattern 233 having the overlapping length Lo may be formed in such a manner that the width thereof is greater than the width of the first ground pattern 231. Accordingly, the overlapping region having the overlapping length Lo makes it possible to reduce the overall size of the antenna, as well as improving the antenna bandwidth attribute.

Figure 8:
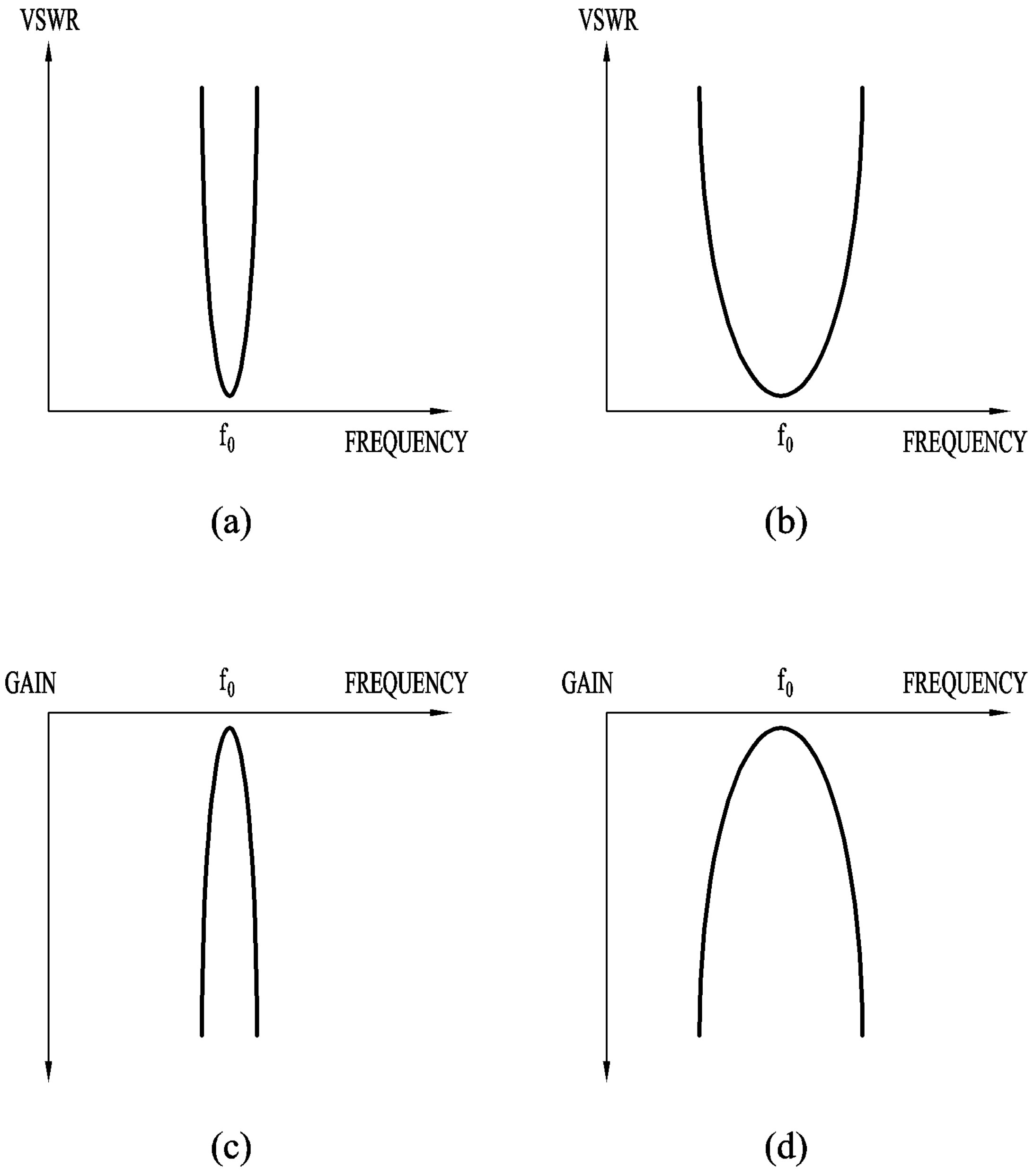
FIG. 8 is a set of graphs illustrating a comparison between an antenna bandwidth attribute and an antenna efficiency attribute that vary with antenna structures in FIG. 7.

FIG. 8 illustrates a comparison between the antenna bandwidth attribute and the antenna efficiency attribute that vary with the antenna structures in FIG. 7.

Referring to FIGS. 7 and 8(*a*), a voltage standing wave ratio (VSWR) of the dipole antenna has the lowest value at a first frequency $f_0$ in a first frequency band. Therefore, a resonating frequency of the dipole antenna may be determined as the first frequency $f_0$ in the first frequency band. Referring to FIGS. 7 and 8(*b*), a VSWR of the antenna structure 200 has the lowest value at the first frequency $f_0$ in the first frequency band. Therefore, a resonating frequency of the antenna structure 200 may also be determined as the first frequency $f_0$ in the first frequency band. In this regard, an impedance bandwidth of the antenna structure 200 is formed to be greater than an impedance bandwidth of the dipole antenna, and thus the antenna structure 200 operates in broadband. The antenna structure 200 operating in broadband has a wider bandwidth. Thus, when wearing the earbud, the contact with the human body changes the antenna attribute, thereby reducing sensitivity.

Referring to FIGS. 7, 8(*c*), and 8(*d*), a gain (or efficiency) of the antenna structure 200 has a higher value at the first frequency $f_0$ than a gain (or efficiency) of the dipole antenna. The antenna structure 200 also has a wider bandwidth attribute than the dipole antenna in terms of an antenna gain (or antenna efficiency).

Figure 9:
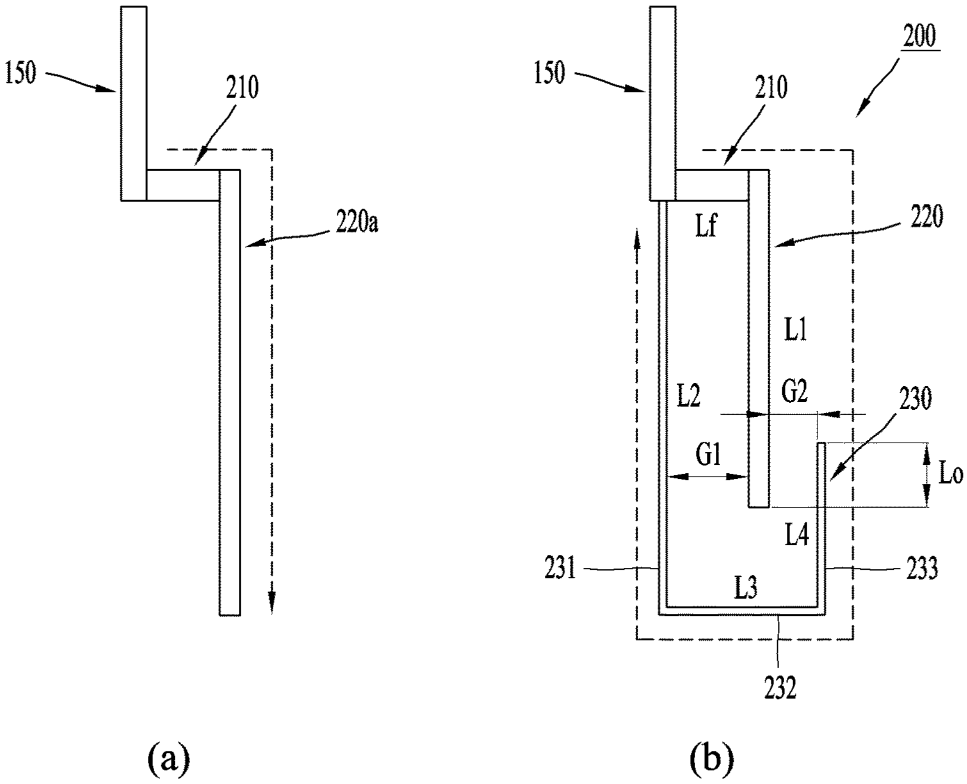
FIG. 9 is a set of views illustrating a structure of the dipole antenna and an antenna structure that features the coupled loop structure, along with a set of graphs showing double resonance attributes that result from these structures.
Figure 9:
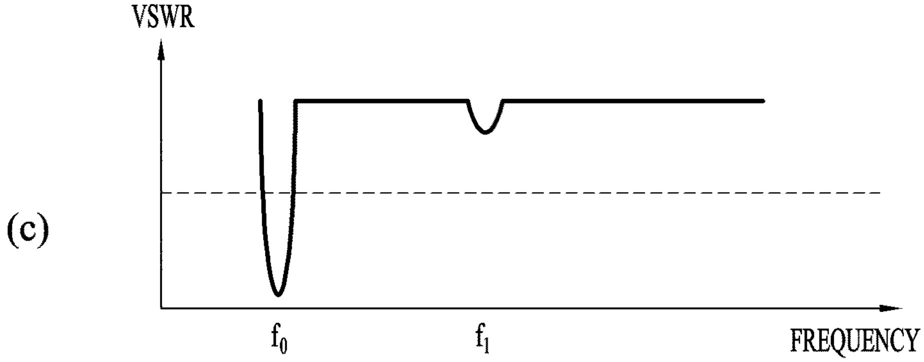
Figure 9:
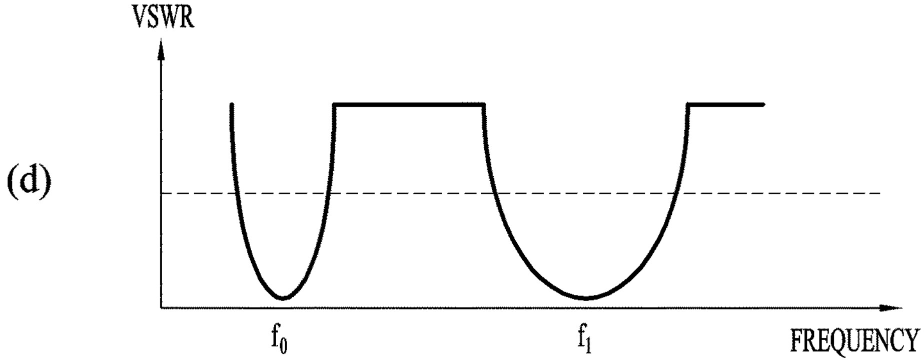

The antenna structure that features the coupled loop structure may also operate as a radiator in a second frequency band other than the first frequency band. Accordingly, the antenna structure that features the coupled loop structure may operate as a multi-band radiator that operates in multiple bands. FIG. 9 illustrates a structure of the dipole antenna and the antenna structure that features the coupled loop structure, and shows double resonance attributes that result from these structures.

Referring to FIGS. 7 and 9(*a*), the dipole antenna is configured to include the feeder 210 connected to the PCB 150, and the antenna pattern 220*a* connected to the feeder 210. The resonance length of the dipole antenna may be determined by the sum of the length of the feeder 210 and the length of the antenna pattern 220*a*. The antenna pattern 220*a* has a greater length than the feeder 210 and operates as a main radiator. Therefore, the antenna pattern 220*a* may be referred to as a resonating element arm.

The radiator structure is not limited to the dipole antenna, but may be embodied as the monopole antenna or the inverted-F antenna. When the radiator structure is embodied as the monopole antenna, the sum of the length of the feeder 210 and the length of the antenna pattern 220*a* may be determined as a predetermined range value at one-fourth of a wavelength in the first frequency band.

Referring to FIGS. 7 and 9(*b*), the antenna structure 220 may be configured to include the feeder 210 connected to the PCB 150, the antenna pattern 220 connected to the feeder 210, and the ground pattern 230 that achieves coupling with the antenna pattern 220. A resonance length of the antenna structure 220 may be determined as a value that is obtained by subtracting an overlapping length from the sum of the length of the feeder 210, the length of the antenna pattern 220, and the length of the ground pattern 230.

The length and width of the antenna pattern 220*a* may be adjusted for performance tuning of the antenna in FIGS. 8(*b*) and 9(*a*). An impedance matching attribute may be changed by adjusting the length and width of the antenna pattern 220*a*, and accordingly, a resonating frequency may be changed. The length and width of the antenna pattern 220 may be adjusted for performance tuning of the antenna structure 200 in FIGS. 7(*b*) and 8(*b*). The length and width of the ground pattern 230 may be adjusted for performance tuning of the antenna structure 200. In addition, the performance of the antenna structure 200 may be tuned by adjusting gaps G1 and G2 between the antenna pattern 220 and the ground pattern 230. An impedance matching attribute of the antenna structure 200 may be changed through the above-described parameter adjustment, and accordingly, the resonating frequency may be changed.

Referring to FIGS. 6(*b*), 9(*a*) and 9(*c*), double band operation of the antenna in the first frequency band and the second frequency band is described. The antenna exhibits dual resonance at the first frequency $f_0$ in the first frequency band and at the second frequency $f_1$ in the second frequency band. However, a VSWR value of the antenna at the second frequency $f_1$ is higher than a VSWR value of the antenna at the first frequency $f_0$, thereby reducing the antenna performance. The VSWR value of the antenna at the second frequency $f_1$ is at or above a threshold value, and thus the antenna cannot substantially operate as a radiator in the second frequency band. Therefore, it is not easy for the antenna structures in FIGS. 7(*b*) and 8(*a*) to achieve multi-resonance.

Referring to FIGS. 6(*c*), 9(*b*), and 9(*d*), the antenna structure 200 may be embodied in such a manner as to perform double band operation at the first frequency band and the second frequency band. The antenna structure 200 exhibits double resonance at the first frequency $f_0$ in the first frequency band and at the second frequency $f_1$ in the second frequency band. The VSWR value of the antenna at the second frequency $f_1$ and the VSWR value of the antenna at the first frequency $f_0$ are both at or below the threshold value. Therefore, the antenna structure 200 may be embodied in such a manner as to operate in the first frequency band and the second frequency band. Therefore, with the antenna structure 200 in FIGS. 6(*c*) to 9(*b*), it is possible to achieve double resonance.

Figure 10:
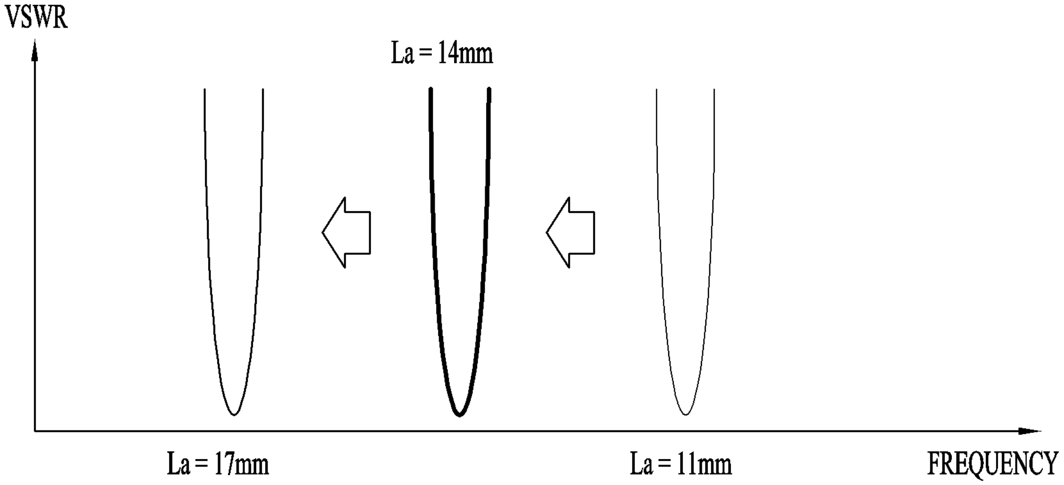
FIG. 10 is a set of graphs showing VSWR attributed that result from parameter adjustment in the antenna structures in FIGS. 9(*a*) and 9(*b*).
Figure 10:
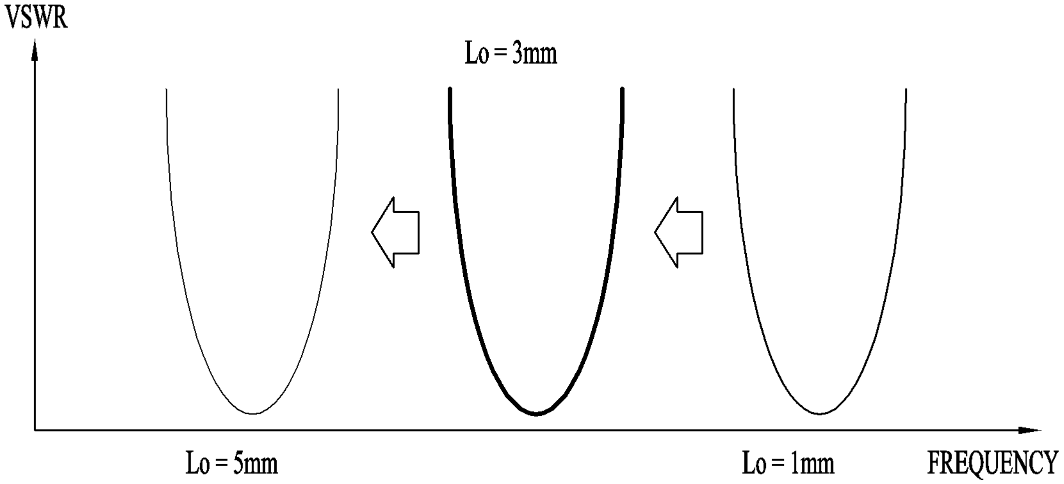

An antenna resonance attribute that results from parameter adjustment in the antenna structure in FIGS. 9(*a*) and 9(*b*) is described as follows. In this regard, FIG. 10 illustrates VSWR attributes that result from the parameter adjustment in the antenna structures in FIGS. 9(*a*) and 9(*b*).

In the antenna in FIG. 9(*a*), the resonating frequency of the antenna may be adjusted by adjusting an effective length La, which is the sum of the length of the feeder 210 and the length of the antenna pattern 220*a*. Referring to FIGS. 9(*a*) and 10(*a*), as La is set to 11 mm, 14 mm, and 17 mm, the resonating frequency shifts to a lower frequency. In this regard, in order to set the resonating frequency of the antenna, which is to be arranged within the earbud, to the 2.4 GHz band, the resonance length of the antenna has to be maintained at a length that corresponds to half a wavelength or one-fourth of a wavelength. Therefore, it is difficult to reduce the resonance length of the antenna to a predetermined level or lower, which is below one-fourth of the wavelength. Accordingly, the antenna in FIG. 9(*a*) has to be formed in such a manner that the effective length La thereof is equal to or greater than a predetermined length. However, when considering the effective length La of the antenna, there is a limitation in reducing the length of the bar portion that corresponds to the stalk portion of the earbud.

In the antenna structure 200 in FIG. 9(*b*), the resonating frequency of the antenna may be adjusted by adjusting the respective overlapping lengths Lo of the antenna pattern 220 and the ground pattern 230. Referring to FIGS. 9(*b*) and 10(*b*), as Lo is set to 1 mm, 3 mm, and 5 mm, the resonating frequency shifts to a lower frequency. In this regard, it is also possible to change the resonating frequency by increasing the respective overlapping lengths Lo of the antenna pattern 220 and the ground pattern 230, without increasing an effective length of the antenna structure 200. Therefore, in the antenna structure 200, it is possible to tune the resonating frequency by increasing the overlapping lengths Lo, without increasing the maximum length along one axial direction of the ground pattern 230. Therefore, the resonating frequency may be consistently maintained while increasing the overlapping lengths Lo and reducing a length along one axial direction of the antenna structure 200. Accordingly, there is provided an advantage in that the length of the bar portion, which corresponds to the stalk portion of the earbud, can be reduced while maintaining the resonating frequency of the antenna structure 200.

Referring to FIGS. 1 to 3 and 5 to 10, the earbud 100 may be configured to include the housing 120, the antenna structure 200, and the printed circuit board (PCB) 150. The housing 120 may include the main body portion 120*b* in which the speaker port is provided, and the stalk 120*a* that extends from the maintain body portion 120*b*. The antenna structure 200 may be configured to be arranged within the stalk 120*b* and to radiate a wireless signal out of the earbud

100. The PCB 150 may be configured to be electrically connected to the antenna structure 200.

The antenna structure 200 may be formed within the housing 120 of the earbud 100. The antenna structure 200*a* may include the feeder 210, the antenna pattern 220, and the ground pattern 230. In this regard, the feeder 210 may be configured to be connected to the signal pattern on the PCB 150 and to transfer a signal to the antenna pattern 220. The antenna pattern 220 may be formed to a first length L1 in such a manner as to be connected to the feeder 210 and to radiate a signal. The ground pattern 230 may be configured to be connected to the ground pattern on the PCB 150. The ground pattern 230 may be formed in such a manner as to surround the antenna pattern 230 over a second length L2 on one side of the antenna pattern 220 and a third length L3 on the other side thereof.

The ground pattern 230 may be configured to include a plurality of conductive patterns. The ground pattern 230 embodied as the plurality of conductive patterns may be formed to surround the antenna pattern 220. The ground pattern 230 may be configured to include the first ground pattern 231 and a second ground pattern 232. Accordingly, the ground pattern 230 may be arranged to surround the antenna pattern 220 in a region under the antenna pattern 220 and in regions adjacent to both sides of the antenna pattern 220.

In order to further reduce the overall length of the antenna structure 200, the ground pattern 230 may be configured to include the first ground pattern 231, the second ground pattern 232, and the third ground pattern 233. The first ground pattern 231 may be configured to be connected to the ground pattern on the PCB 150. The first ground pattern 231 may be formed to the second length L2 on one side of the antenna pattern 230. The second ground pattern 232 may be formed to be connected to the first ground pattern 231. The second ground pattern 232 may be formed to a fourth length L4 in the region under the antenna pattern 220. The third ground pattern 232 may be formed to be connected to the second ground pattern 232. The third ground pattern 232 may be formed to the third length L3 on the other side of the antenna pattern 220.

The first ground pattern 231 and the third ground pattern 233 may be formed in such a manner that the widths W2 thereof are greater than the width W1 of the antenna pattern 220. As another example, the first ground pattern 231 and the third ground pattern 233 may be formed in such a manner that at least one of the widths W2 thereof is greater than the width W1 of the antenna pattern 220. In this regard, the third ground pattern 233 having the overlapping length Lo may be formed in such a manner that the width thereof is greater than the width of the first ground pattern 231. Accordingly, the overlapping region having the overlapping length Lo makes it possible to reduce the overall size of the antenna, as well as improving the antenna bandwidth attribute.

The second ground pattern 232 may be formed to be perpendicular to the first ground pattern 231. The second ground pattern 232 may be arranged to be in parallel to the feeder 220. The third ground pattern 233 may be formed to be perpendicular to the second ground pattern 232. The third ground pattern 233 may be arranged to be in parallel to the antenna pattern 220. The third ground pattern 233 may form an overlapping region that overlaps with the antenna pattern 220 over a predetermined length along one axial direction on the other side of the antenna pattern 220. The third ground pattern 233 may be arranged in parallel to the antenna pattern 220 along one axial direction and may be arranged to have an overlapping length Lo along the other axial direction.

The second ground pattern 232 may be formed in such a manner that a length L4 thereof is greater than a length Lf of the feeder 210 along the other axial direction perpendicular to one axial direction. Accordingly, the ground pattern 230 may be formed to surround the antenna pattern 2220 on one side and the other side of the antenna pattern 220. Therefore, the entire size of the antenna structure 200 can be reduced compared to a case where the ground pattern 230 is formed on only one side or the other side.

The antenna structure 200 may be embodied in such a manner that a length from the feeder 210 up to the ground pattern 230 connected to the PCB 150 falls within a predetermined range of lengths where the median corresponds to half a wavelength in the 2.4 GHz band. In the regard, the resonating frequency and the antenna attribute, such as an impedance matching attribute, can be adjusted by adjusting the overlapping length Lo between the antenna pattern 220 and the ground pattern 230. The volume of the antenna can be increased using the entire portion of the earbud 100 that corresponds to the stalk 122, and thus the antenna structure 200 can achieve improvements in bandwidth and efficiency compared to the existing inverted-F antenna.

In this regard, the antenna structure 200 may operate as a radiator in the Bluetooth band that is the 2.4 GHz band. The antenna structure 200 may operate as a radiator by the total length resulting from the sum of the first length L1 of the antenna pattern 220, the second length L2 of the first ground pattern 231, the connection length L4 of the second ground pattern 232, and the third length L3 of the third ground pattern 233. By the sum of the lengths L1, L2, L3, and L4, the antenna structure 200 may be formed to fall within a predetermined range of lengths where the median corresponds to half a wavelength in the 2.4 GHz band. By the subtraction of the overlapping length Lo from the total length resulting from the sum of the lengths L1, L2, L3, and L4, the antenna structure 200 may be formed to fall within a predetermined range of lengths where the median corresponds to half a wavelength in the 2.4 GHz band.

In addition, the antenna structure 200 may operate as a radiator in a frequency band other than the 2.4 GHz band. As an example, the antenna structure 200 may also operate as a radiator in the 5 GHz band. The antenna structure 200 may also operate as a radiator in the UWB band, which is the 5 GHz, or in the Wi-Fi band. In this regard, in the antenna structure 200 having the overlapping length Lo, an amount of coupling between the antenna pattern 220 and the ground pattern 230 can be reduced in the 5 GHz band, compared to the 2.4 GHz. Accordingly, in the 5 GHz band, the resonance length of the antenna structure 200 may be determined as the length L1 of the antenna pattern 220. The antenna structure 200 may be formed in such a manner that the resonance length thereof in the 5 GHz band is greater than the length L1 of the antenna pattern 220 by a length that falls within a predetermined range of lengths.

A length of each portion of the antenna structure 200, which operates in a double band consisting of the first frequency band and the second frequency band, may be determined as follows. In this regard, the antenna structure 200 operating in the double band may operate as a radiator in the 2.4 GHz band and the 5 GHz band. The respective overlapping regions of the antenna pattern 220 and the third ground pattern 233 may be formed in such a manner that lengths Lo thereof range from 1 mm to 5 mm. In this regard, FIGS. 11A and 11B illustrate antenna structures, respectively, that have different lengths of overlapping regions in embodiments.

FIG. 10(*a*) illustrates an antenna structure 200-1 in a case where the length Lo of the overlapping region is 1.5 mm. FIG. 10(*b*) illustrates an antenna structure 200-2 in a case where the length Lo of the overlapping region is 4.0 mm. Referring to FIGS. 10(*a*) and 10(*b*), an increase in the length Lo of the overlapping region can further decrease the length of the antenna pattern 220 and the length of the ground pattern 230. Accordingly, the increase in the length Lo of the overlapping region can decrease the overall size of the antenna structure 200-2.

However, when the length Lo of the overlapping region increases to a first threshold value or higher, the overall size can decrease, thereby somewhat reducing the bandwidth attribute. When the length Lo of the overlapping region decreases to a second threshold value or lower, the overall size increases, and the double resonance attribute may not occur.

Figure 11A:
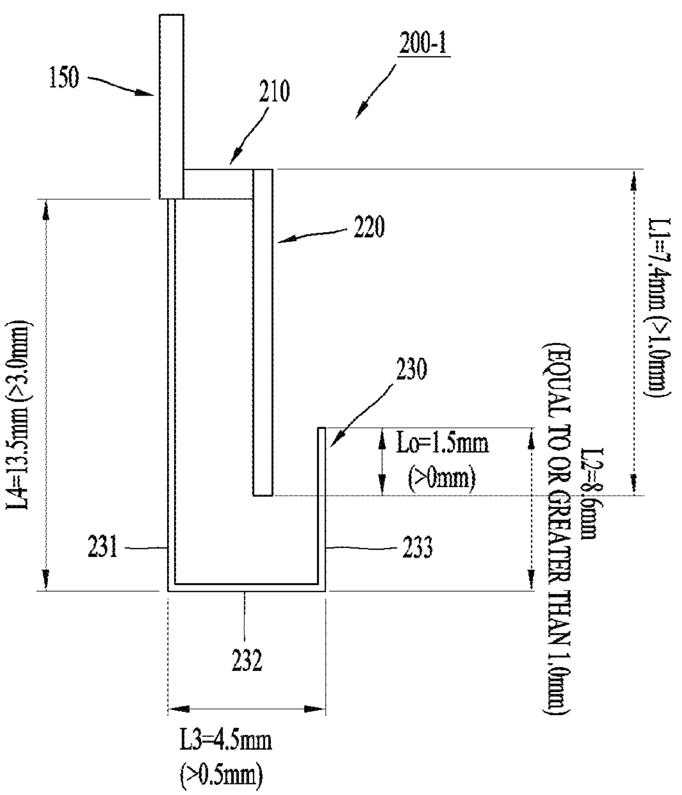
FIGS. 11A and 11B are views illustrating antenna structures, respectively, that have different lengths of overlapping regions in embodiments.
Figure 11B:
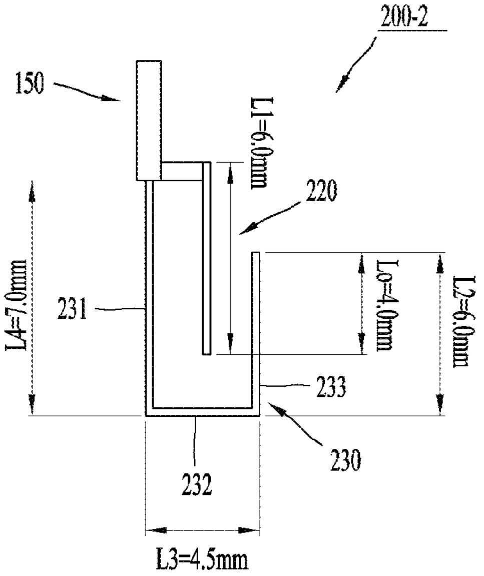

Referring to FIGS. 11A and 11B, the respective overlapping regions of the antenna pattern 220 and the third ground pattern 233 may be formed in such a manner that the lengths Lo thereof range from 1 mm to 5 mm. Referring to FIG. 10(*a*), a first exemplary structure may be formed in such a manner that the first length L1 of the antenna pattern 220 is 1.0 mm or greater. As an example, the antenna pattern 220 may be formed in such a manner that the first length L1 thereof falls within a predetermined range of lengths where the median is approximately 7.4 mm, but is not limited to this length range. The first length L1 of the antenna pattern 220 may be determined in a manner that varies with a housing material of the earbud, the influence of nearby components, and the length Lo of the overlapping region.

The first ground pattern 231 may be formed in such a manner that the second length L2 thereof is 3.0 mm or greater. As an example, the first ground pattern 231 may be formed in such a manner that the second length L2 thereof falls within a predetermined range of lengths where the median is approximately 13.5 mm, but is not limited to this length range. The first ground pattern 231 may be formed in such a manner that the second length L2 thereof is smaller than the maximum length of the stalk of the earbud, that is, the maximum length of the bar portion.

The second ground pattern 232 may be formed in such a manner that the connection length L4 thereof is 0.5 mm or greater. As an example, the second ground pattern 232 may be formed in such a manner that the connection length L4 thereof falls within a predetermined range of lengths where the median is approximately 4.5 mm, but is not limited to this length range. The second ground pattern 232 may be formed in such a manner that the connection length L4 thereof is smaller than the maximum length of the stalk of the earbud, that is, the maximum length of the bar portion.

The third ground pattern 233 may be formed in such a manner that the third length L3 thereof is 1.0 mm or greater. As an example, the third ground pattern 233 may be formed in such a manner that the third length L3 thereof falls within a predetermined range of lengths where the median is approximately 8.6 mm, but is not limited to this length range. The third length L3 of the third antenna pattern 233 may be determined in a manner that varies with the housing material of the earbud, the influence of nearby components, and the length Lo of the overlapping region.

Referring to FIG. 11A, a second exemplary structure may be formed in such a manner that the lengths Lo of the respective overlapping regions of the antenna pattern 220 and the third ground pattern 233 fall within a predetermined range of lengths where the median is 1.5 mm. The antenna pattern 220 may be formed in such a manner that the first length L1 thereof falls within a predetermined range of lengths where the median is 7.4 mm. The first antenna pattern 231 may be formed in such a manner that the second length L2 thereof falls within a predetermined range of lengths where the median is 13.5 mm. The second antenna pattern 232 may be formed in such a manner that the connection length L4 thereof falls within a predetermined range of lengths where the median is 4.5 mm. The second antenna pattern 233 may be formed in such a manner that the third length L3 thereof falls within a predetermined range of lengths where the median is 8.6 mm. Accordingly, the total length of the second exemplary structure of the antenna structure 220 may be determined as L1+L2+L3+L4−Lo=7.4 mm+13.5 mm+4.5 mm+8.6 mm−1.5 mm=32.5 mm.

Referring to FIG. 11B, a third exemplary structure may be formed in such a manner that the lengths Lo of the respective overlapping regions of the antenna pattern 220 and the third ground pattern 233 fall within a predetermined range of lengths where the median is 4.0 mm. The antenna pattern 200 may be formed in such a manner that the first length L1 thereof falls within a predetermined range of lengths where the median is 6.0 mm. The first ground pattern 231 may be formed in such a manner that the second length L2 thereof falls within a predetermined range of lengths where the median is 7.0 mm. The second ground pattern 232 may be formed in such a manner that the connection length L4 thereof falls within a predetermined range of lengths where the median is 4.5 mm. The second ground pattern 233 may be formed in such a manner that the third length L3 thereof falls within a predetermined range of lengths where the median is 6.9 mm. Accordingly, the total length of the third exemplary structure of the antenna structure 220 may be determined as L1+L2+L3+L4−Lo=6.0 mm+7.0 mm+4.5 mm+6.0 mm−4.0 mm=19.5 mm. Therefore, the antenna performance can also be maintained while reducing the length of the entire antenna structure by increasing the overlapping length Lo.

Referring to FIGS. 11A and 11B, as the overlapping length L increases from 1.5 mm up to 4.0 mm, the length L4 of the antenna structure 200 can decrease from 13.5 mm to 7.0 mm. Since the ground pattern 230 is formed to surround the antenna pattern 220, the maximum length L4 of the antenna structure 200 corresponds to the length L4 of the third ground pattern 233. The length L4 of the antenna pattern 220 having the overlapping length Lo ranges from 7.0 mm to 13.5 mm. In contrast, the antenna structure in FIG. 6(*b*) is formed to have a length ranging from approximately 26 mm to 30 mm.

The length of the antenna structure 200 in which the ground pattern 230 according to the present disclosure is formed to surround the antenna pattern 220 and to have the overlapping region can be reduced to half or less. Therefore, through the antenna structure 200 according to the present disclosure, not only can the antenna bandwidth and gain performance be improved, but an antenna length can also be reduced, thereby reducing the length of the bar portion of the earbud and improving content reception performance and user convenience.

Figure 12:
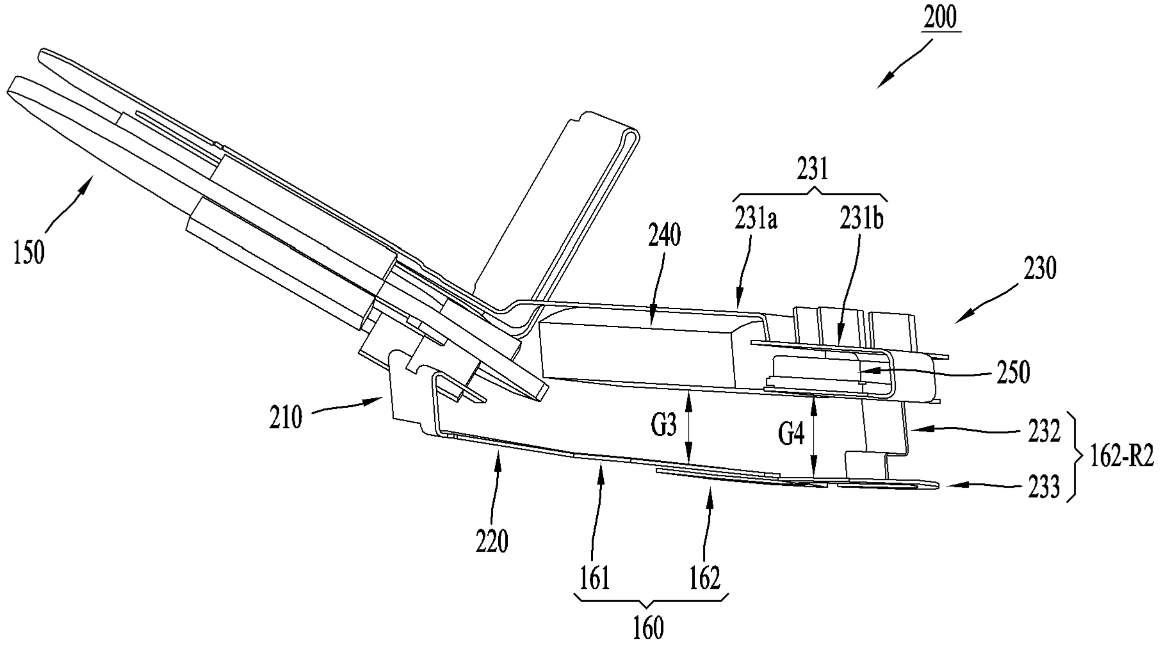
FIG. 12 is a view illustrating the earbud according to the present disclosure and an internal structure of the earbud, when viewed from a lateral surface of the earbud.
Figure 13:
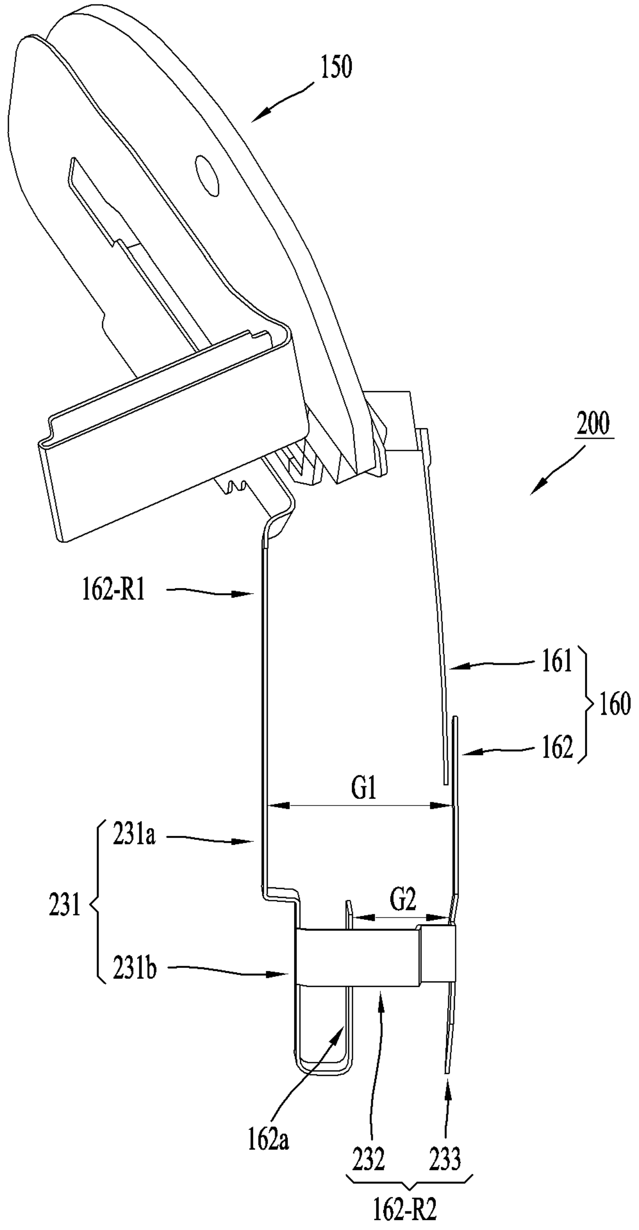
FIG. 13 is a view illustrating a structure in which an antenna pattern and a ground pattern are embodied in the form of an FPCB, when viewed from the lateral surface of the earbud in FIG. 12.
Figure 14:
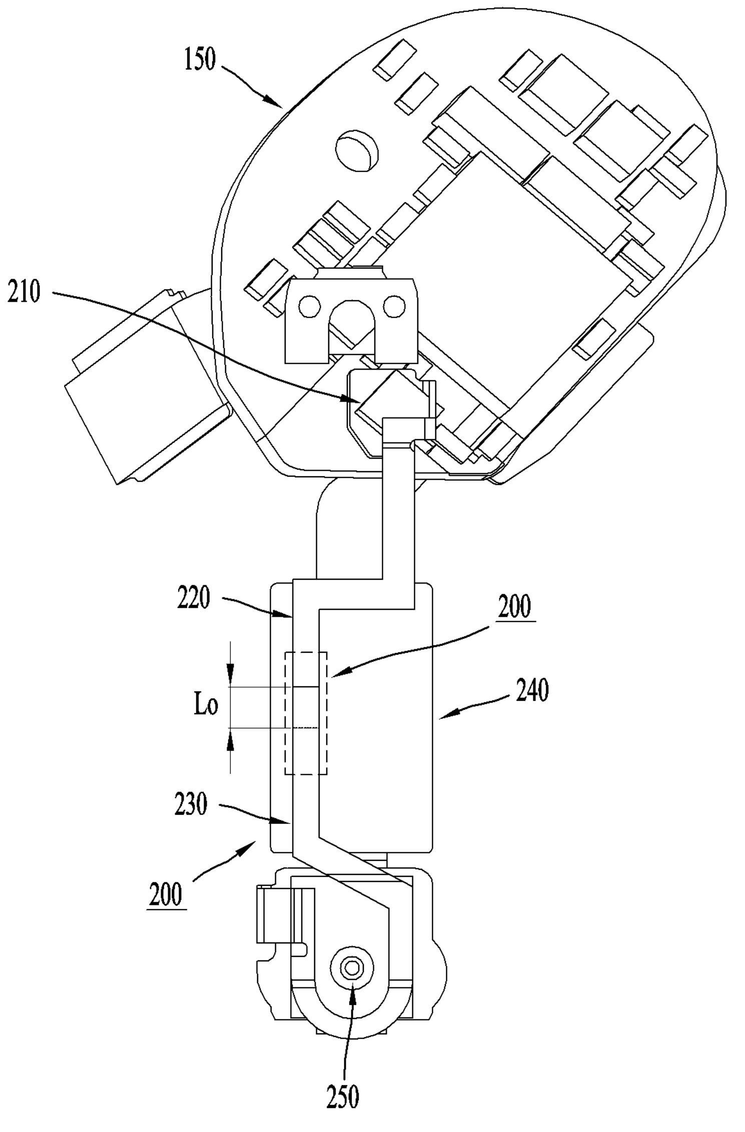
FIG. 14 is a view illustrating the earbud and the internal structure of the earbud, when viewed from the front surface of the earbud in FIG. 12.

The antenna structure of the earbud according to the present disclosure may be embodied on at least one flexible printed circuit board (FPCB). In this regard, FIG. 12 illustrates the earbud according to the present disclosure and an internal structure of the earbud, when viewed from a lateral surface of the earbud. FIG. 13 illustrates a structure in which the antenna pattern and the ground pattern are embodied in the form of the FPCB, when viewed from the lateral surface of the earbud in FIG. 12. FIG. 14 illustrates the earbud and the internal structure of the earbud, when viewed from the front surface of the earbud in FIG. 12.

Referring to FIGS. 12 to 14, the antenna pattern 220 may be formed on a first flexible printed circuit board (FPCB) 161 that is connected to a first surface of the PCB 150. The ground pattern 230 may be formed on a second FPCB 162 that is connected to a second surface facing the first surface of the PCB 150. The second FPCB 162 may be formed to have a plurality of regions. The first FPCB 161 and the second FPCB 162 may be collectively referred to as an FPCB 160.

The second FPCB 162 may be formed to have a first region 162-R1 and a second region 162-R2. The first region 162-R1 may be formed in such a manner as to be attached to the second surface of the PCB 150 and thus to enable a ground of the PCB 150 to extend. The first region 162-R1 may correspond to the first ground region 231 in FIG. 5. The second region 162-R2 is formed to surround the antenna pattern 220 and may form a radiation region by being coupling-combined with the antenna pattern 220. The second region 162-R2 may correspond to the second ground region 232 and the third ground region 233 in FIG. 5.

Components other than the antenna structure 200 may be arranged in the earbud according to the present disclosure. The earbud 100 may further include the battery 240 and the microphone module 250. The battery 240 may be arranged in a space between the first FPCB 161 and the second FPCB 162. The battery 240 may be attached to the second FPCB 162 on which the first ground pattern 231 is formed.

The ground pattern 231 may be formed in a bent structure in such a manner that different components are arranged. In this regard, the ground pattern 231 may be configured to include a first sub-pattern 231*a* and a second sub-pattern 231*b*. The first sub-pattern 231*a* may be arranged to be separated by a first gap G1 from the third ground pattern 233. The second sub-pattern 231*b* may be formed by extending downward from an end portion of the first sub-pattern 231*a*. The second sub-pattern 231*b* may be arranged to be separated, by a second gap G2, which is narrower than the first gap G1, from the third ground pattern 233.

The microphone module 250 may be attached to the second sub-pattern 231*b*. The microphone module 250 may be arranged in the space between the first FPCB 161, on which the antenna pattern 220 is formed, and the second FPCB 162.

The battery 240 may be arranged on the first region 162-R1 of the second FPCB 162. An upper region of the battery 240 may be attached to the second FPCB 162 on which the first ground pattern 231 is formed. A lower region of the battery 240 may be arranged to be separated by a third gap G3 from the second FPCB 162 on which the third ground pattern 233 is formed.

The microphone module 250 may be arranged on the second region 162-R2 of the second FPCB 162. A lower region of the microphone module 250 may be arranged on a support portion 162*a* of the second FPCB 162. The lower region of the microphone module 250 may be arranged to be separated by the third gap G3 from the first FPCB 162 on which the third ground pattern 233 is formed. Accordingly, the lower region of the battery 240 and the lower region of the microphone module 250 may form the first ground pattern 231. Therefore, although the second FPCB 162 is formed in a bent manner, the first ground pattern 231 may be formed to a predetermined height. In this regard, in a case where the second FPCB 162 is bent, the battery 240 is arranged on the first region 162-R1, and a separate component is arranged over the second region 162-R2. Thus, electronic components and modules other than the antenna structure may be optimally arranged.

A first surface of the battery 240 and a second surface of the microphone module 250 may be attached to the second FPCB 162. A second surface of the battery 240 and the second surface of the microphone module 250 may form the first ground pattern 231. Therefore, although the second FPCB 162 is formed in a bent manner, the first ground pattern 231 may be formed to a predetermined height. In this regard, in the case where the second FPCB 162 is bent, the battery 240 is arranged on the first region 162-R1, and a separate component is arranged over the second region 162-R2. Thus, electronic components and modules other than the antenna structure may be optimally arranged.

A gap between the lower region of the battery 240 and the lower region of the microphone module 250, as described above, may be set to be the same or may be set to fall within a predetermined range of gaps. In this regard, the third gap G3 between the second surface of the battery 240 and the third ground pattern 233, and a fourth gap G4 between the second surface of the microphone module 250 and the third ground pattern 233 may be formed to a predetermined gap or narrower.

Referring to FIGS. 9 to 13, the respective overlapping regions of the antenna pattern 220 and the third ground pattern 233 may be formed in such a manner that the lengths Lo thereof fall within a range from 1 mm to 5 mm. The antenna pattern 220 may be formed in such a manner that the first length L1 is 1.0 mm or greater. As an example, the antenna pattern 220 may be formed in such a manner that the first length L1 thereof falls within a predetermined range of lengths where the median is approximately 7.4 mm, but is not limited to this length range. The first length L1 of the antenna pattern 220 may be determined in a manner that varies with the housing material of the earbud, the influence of nearby components, and the length Lo of the overlapping region.

The first ground pattern 231 may be formed in such a manner that the second length L2 is 3.0 mm or greater. As an example, the first ground pattern 231 may be formed in such a manner that the second length L2 thereof falls within a predetermined range of lengths where the median is approximately 13.5 mm, but is not limited to this length range. The first ground pattern 231 may be formed in such a manner that the second length L2 thereof is smaller than the maximum length of the stalk of the earbud, that is, the maximum length of the bar portion.

The second ground pattern 232 may be formed in such a manner that the connection length L4 thereof is 0.5 mm or greater. As an example, the second ground pattern 232 may be formed in such a manner that the connection length L4 thereof falls within a predetermined range of lengths where the median is approximately 4.5 mm, but is not limited to this length range. The second ground pattern 232 may be formed in such a manner that the connection length L4 thereof is smaller than the maximum length of the stalk of the earbud, that is, the maximum length of the bar portion.

The third ground pattern 233 may be formed in such a manner that the third length L3 thereof is 1.0 mm or greater. As an example, the third ground pattern 233 may be formed in such a manner that the third length L3 thereof falls within a predetermined range of lengths where the median is approximately 8.6 mm, but is not limited to this length range. The third length L3 of the third antenna pattern 233 may be determined in a manner that varies with the housing material of the earbud, the influence of nearby components, and the length Lo of the overlapping region.

The antenna structure included within the earbud according to the present disclosure and the earbud including the antenna structure are described above. The antenna structure included within the earbud according to the present disclosure and an electronic device including the antenna structure are described below referring to the above-described structural and technical features. In this regard, the earbud may be referred to as the electronic device. The earbud receives content such as music through wireless communication with a mobile terminal (a host device), and therefore, the wireless earbud may also be regarded as an electronic device. The above-described structural and technical features may apply to the electronic device described below. In addition, a configuration of the antenna structure (the antenna module), which is described below, and a wireless connection technique through the electronic device including the antenna structure may also apply to the above-described earbud.

Figure 15:
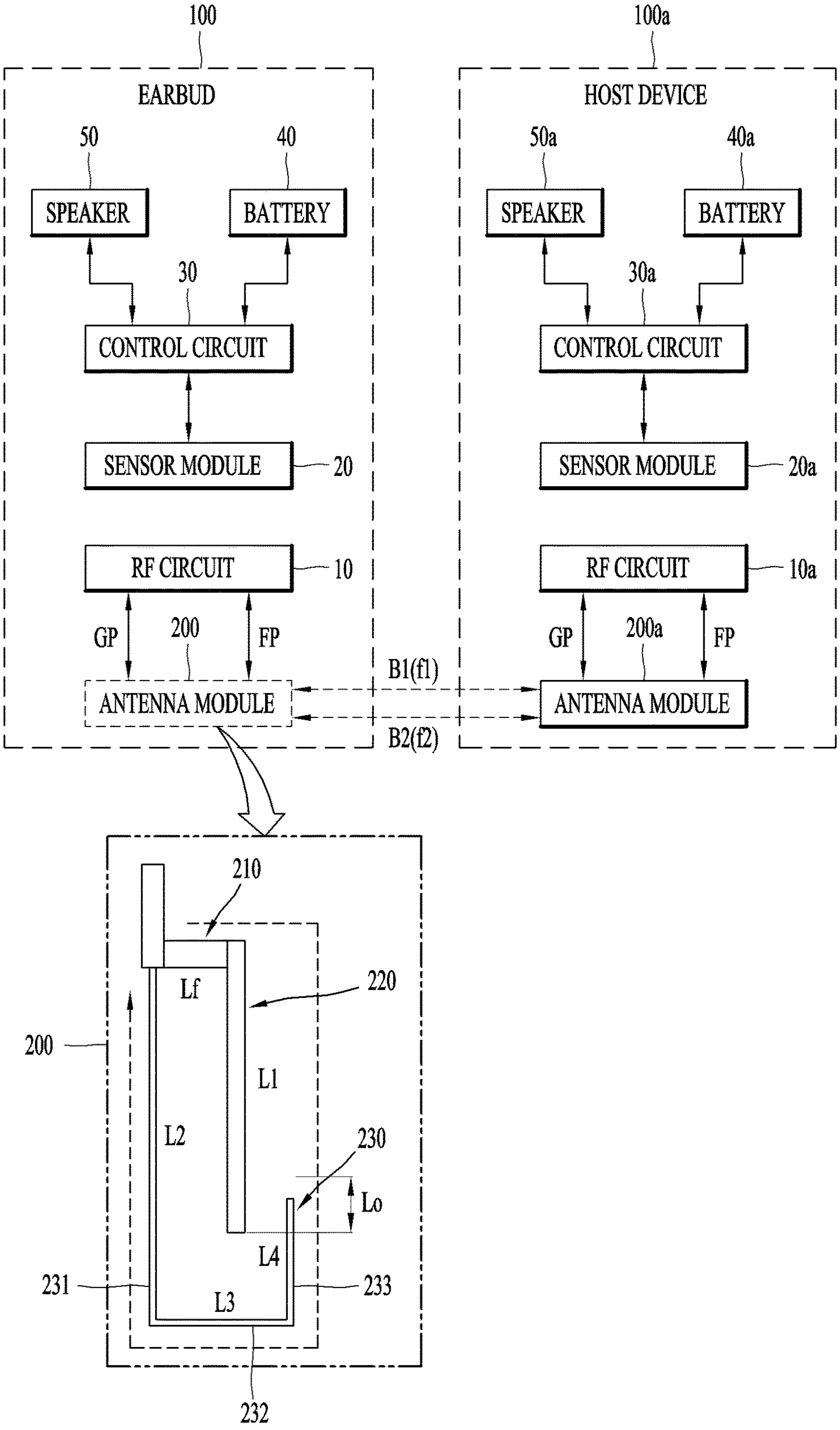
FIG. 15 is a diagram illustrating a configuration of an electronic device, which includes an antenna module according to the present disclosure, and a configuration of the antenna module.

In this regard, FIG. 15 illustrates a configuration of the electronic device which, as described, includes the antenna module according to the present disclosure, and a configuration of the antenna module. An electronic device 100 includes the antenna module 200 and may further include the RF circuit 10 and a processor 30. Referring to FIGS. 1 to 15, the electronic device 100 including the antenna structure is described. In this regard, the electronic device 100, such as the wireless earbud, may include the antenna module 200 in FIGS. 1 and 14 and a dielectric housing 120 in FIG. 2.

Referring to FIGS. 1 to 15, the electronic device 100, such as the wireless earbud, may further include the RF circuit 10, the sensor module 20, the control circuit 30, the battery 40 or 240, and the microphone 50 or 250. A memory is included in the control circuit 30 or may also be provided separately. In a case where the electronic device 100, such as the wireless earbud, includes the memory, the electronic device 100 may receive a wireless signal from a host device 100*a* through a Wi-Fi wireless interface other than Bluetooth and UWB interfaces. The memory may be configured to store received content, control information, or setting information.

Referring to FIGS. 1 to 15, the electronic device 100 including the antenna module 200 is described. The electronic device 100 may be configured to include the dielectric housing 120 and the antenna module 200. The dielectric housing 120 may be configured to include a main body portion 120*b* having a port, and a protruding portion 122 extending from the main body portion 120*b*.

The antenna module 200 may be configured to be arranged within the protruding portion 122 and to radiate a wireless signal out of the electronic device. The antenna module 200 may include the feeder 210 configured in such a manner as to be connected to a signal pattern on a circuit structure arranged within the main body portion 120 and to transfer a signal. The antenna module 200 may include a radiator pattern 220 that is formed to the first length L1 in such a manner as to be connected to the feeder and to radiate a signal. The antenna module 200 may include the ground pattern 230 that is formed to be connected to the ground pattern on the circuit structure and to surround the radiator pattern 220 on one side and the other side of the radiator pattern 220. The ground pattern 230 may be formed to the second length L2 and the third length L3 in such a manner as to surround one side of the radiator pattern 220 and a lower region thereof. The ground pattern 230 may be formed to the second to fourth lengths L2 to L4 in such a manner as to surround one side of the radiator pattern 220, the lower region thereof, and the other side thereof.

The circuit structure may be embodied as a printed circuit board (PCB) configured to be electrically connected to the antenna module 220. The ground pattern 230 may include the first ground pattern 231 that is connected to the ground pattern on the PCB 150 and is formed to the second length on one side of the radiator pattern 220. The ground pattern 230 may include the second ground pattern 232 that is connected to the first ground pattern 231 and is formed to the second length L2. The ground pattern 230 may include the third ground pattern 233 that is connected to the second ground pattern 232 and is formed to the fourth length L4 on the other side of the radiator pattern 220.

The second ground pattern 232 may be formed perpendicularly to the first ground pattern 231. The second ground pattern 232 may be arranged in parallel to the feeder 210. The third ground pattern 233 may be formed perpendicularly to the second ground pattern 232. The third ground pattern 233 may be arranged in parallel to the radiator pattern 220. The third ground pattern 233 forms an overlapping region that overlaps with the radiator pattern 220 over a predetermined length along one axial direction on the other side of the radiator pattern 220. The overlapping region has the length Lo that extends along one axial direction.

The radiator pattern 220 may be formed on the first flexible printed circuit board (FPCB) 161 that is connected to the first surface of the PCB 150. The ground pattern 230 may be formed on the second FPCB 162 that is connected to the second surface that faces the first surface of the PCB 150. The second FPCB 162 may include the first region 162-R1 that is attached to the second surface of the PCB 150. The second FPCB 162 may include the second region 162-R2 that is formed to surround the radiator pattern 220 and forms a radiation region by being coupling-combined with the radiation pattern 220.

The electronic device 100 can improve content reproduction capability by receiving a wireless signal through a different wireless interface than the host device 100*a*. In this regard, as described, FIG. 14 illustrates the configuration of the electronic device, which includes the antenna module according to the present disclosure, and the configuration of the antenna module. The electronic device 100 includes the antenna module 200 and may further include the RF circuit 10 and the processor 30.

The RF circuit 10 may be configured to be operatively coupled to the antenna module 200 and to transfer a wireless signal in a specific frequency band to the antenna module 200. The processor 30 may be configured to be operatively coupled to the RF circuit 10 and to control the RF circuit 10.

The processor 30 may control the RF circuit 10 in such a manner that a first wireless signal in a first frequency band B1 is received through the antenna module 200. When signal quality of the first wireless signal is at or below a threshold value, a wireless signal may be received through a different frequency band, thereby ensuring stable reception of content contained in the wireless signal. To this end, the processor 30 or a processor of the host device 100*a* may determine whether or not the signal quality of the first wireless signal is at or below the threshold value.

When the signal quality of the first wireless signal is at or below the threshold value, the host device 100*a* may transfer content such as music to the electronic device 100, such as the wireless earbud, through a second wireless signal in the first frequency band. The signal quality of the wireless signal may be determined by determining whether or not an SNR of the wireless signal is at or above a threshold value and whether or not an SINR of the wireless signal is at or above a threshold value, but is not limited to these metrics.

The signal quality of the wireless signal may also be estimated, through the sensor module 20, from the user's motion or non-motion and from a moving speed and/or acceleration at which the user moves. The quality of the wireless signal may be estimated by determining whether or not the user enters a specific region determined as a region where other users stay during a specific time span or by a distance to the specific region. The quality of the wireless signal may be estimated by a value, which results from sensing through the sensor module 20 described above, and may be estimated by determining whether or not the user enters a specific region or by a distance to the specific region. In this regard, the first wireless signal may be a Bluetooth signal in the 2.4 GHz band or a Wi-Fi signal, but is not limited to these signals. The second wireless signal may be a UWB signal in the 5 GHz band or a Wi-Fi signal, but is not limited to these signals.

As another example, in the case of real-time content, the host device 100*a* may transmit the same content to the electronic device 100 through the first wireless signal and the second wireless signal at the same time. According to the signal quality, the processor 30 may also receive the first wireless signal and the second wireless signal selectively or at the same time.

When the signal quality of the first wireless signal is determined as being at or below the threshold value, the processor 30 may control the RF circuit 10 in such a manner that the second wireless signal in the second frequency band B2, which is broader than the first frequency B1, is received from the host device 100*a*. The first wireless signal is a wireless signal at the first frequency f1 in the first frequency band B1, that is, the 2.4 GHz band. The second wireless signal may be a wireless signal at the second frequency f2 in the second frequency band B2, that is, the 5 GHz band. Therefore, the electronic device 100 can improve content reproduction capability by receiving a wireless signal through a different wireless interface than the host device 100*a*.

The configuration of the wireless earbud including the antenna structure is described in detail above. Technical effects of the wireless earbud including the antenna structure described above are summarized as follows, but are not limited to these effects.

According to the present disclosure, the antenna structure with a reduced antenna length is arranged within the housing of the wireless earbud, thereby enabling the reception of a wireless signal containing content.

According to the present disclosure, the antenna structure operates in a plurality of frequency bands in the electronic device such as the wireless earbud, thereby enabling the stable reception of the wireless signal even when surrounding environments change.

According to the present disclosure, the ground pattern is formed to surround the antenna pattern, thereby enabling an increase in the effective volume of the antenna and thus an improvement in the antenna bandwidth attribute.

According to the present disclosure, the ground pattern is formed to surround the antenna pattern, thereby enabling an increase in the effective volume of the antenna and thus an improvement in the antenna efficiency attribute.

According to the present disclosure, the antenna structure can be configured to operate in broadband in the electronic device such as the wireless earbud.

According to the present disclosure, the wireless signal can be stably received even when an antenna resonating frequency changes due to the human body's movement when wearing the wireless earbud or due to the wireless earbud's movement within the ear canal.

According to the present disclosure, a change in antenna performance due to a small antenna arrangement space formed within a mechanism of the wireless earbud can be minimized, thereby enabling stable maintenance of wireless communication performance.

Further scope of applicability of the present disclosure will become apparent from the foregoing detailed description. It should be understood, however, that the detailed description and specific examples, such as the preferred embodiment of the invention, are given by way of illustration only, since various changes and modifications within the idea and scope of the invention will be apparent to those skilled in the art.

In relation to the foregoing description, the antenna module mounted on the vehicle and the operation of controlling the same may be implemented by software, firmware, or a combination thereof. Meanwhile, the configuration of performing the control operation for the millimeter wave band transceiver can be implemented as computer-readable codes in a program-recorded medium. The computer-readable medium may include all types of recording devices each storing data readable by a computer system. Examples of such computer-readable media may include hard disk drive (HDD), solid status disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). Also, the computer may include a controller of a terminal or wireless earbud, namely, a processor. Therefore, it should also be understood that the above-described implementations are not limited by any of the details of the foregoing description, unless otherwise specified, but rather should be construed broadly within its scope as defined in the appended claims, The scope of the invention should be determined by reasonable interpretation of the appended claims and all changes that come within the equivalent scope of the invention are included in the scope of the disclosure.

The invention claimed is:

1. An earbud comprising:
- a housing having a main body portion in which a speaker port is provided and a stalk extending from the main body portion;
- an antenna structure arranged within the stalk and radiating a wireless signal out of the earbud; and
- a printed circuit board (PCB) configured to be electrically connected to the antenna structure,
- wherein the antenna structure comprises:
- a feeder configured to be connected to a signal pattern on the PCB and to transfer a signal;
- an antenna pattern formed to a first length in such a manner as to be connected to the feeder and to radiate the signal; and
- a ground pattern formed in such a manner as to be connected to a ground pattern on the PCB and to surround the antenna pattern on one side and the other side of the antenna pattern,
- wherein the antenna pattern is formed on a first flexible printed circuit board (FPCB) that is connected to a first surface of the PCB,
- wherein the ground pattern is formed on a second FPCB that is connected to a second surface facing the first surface of the PCB, and
- wherein the second FPCB comprises:
- a first region attached to the second surface of the PCB; and
- a second region formed to surround the antenna pattern and forming a radiation region by being coupling-combined with the antenna pattern.

2. The earbud of claim 1, wherein the ground pattern comprises:
- a first ground pattern formed in such a manner as to be connected to the ground pattern on the PCB and to have a second length on one side of the antenna pattern;
- a second ground pattern formed in such a manner as to be connected to the first ground pattern and to have a third length; and
- a third ground pattern formed in such a manner as to be connected to the second ground pattern and to have a fourth length on the other side of the antenna pattern,
- wherein the first ground pattern and the third ground pattern are formed in such a manner that widths thereof are greater than a width of the antenna pattern.

3. The earbud of claim 2, wherein the second ground pattern is formed perpendicularly to the first ground pattern and is arranged in parallel to the feeder, and
- wherein the third ground pattern is formed perpendicularly to the second ground pattern and is arranged in parallel to the antenna pattern.

4. The earbud of claim 2, wherein the third ground pattern forms an overlapping region that overlaps with the antenna pattern over a predetermined length along one axial direction on the other side of the antenna pattern.

5. The earbud of claim 4, wherein the second ground pattern is formed in such a manner that a length thereof is greater than a length of the feeder along the other axial direction perpendicular to the one axial direction.

6. The earbud of claim 2, further comprising:
- a battery attached to the second FPCB and arranged in a space between the first FPCB on which the antenna pattern is formed and the second FPCB, the first ground pattern being formed on the second FPCB.

7. The earbud of claim 6, wherein the first ground pattern comprises:
- a first sub-pattern arranged to be separated by a first gap from the third ground pattern; and
- a second sub-pattern extending downward from an end portion of the first sub-pattern and arranged to be separated by a second gap, which is narrower than the first gap, from the third ground pattern.

8. The earbud of claim 7, further comprising:
- a microphone module attached to the second sub-pattern and arranged in the space between the first FPCB on which the antenna pattern is formed and the second FPCB.

9. The earbud of claim 8, wherein a first surface of the battery and a second surface of the microphone module are attached to the second FPCB, and a second surface of the battery and the second surface of the microphone module forms the first ground pattern.

10. The earbud of claim 9, wherein a third gap between the second surface of the battery and the third ground pattern and a fourth gap between the second surface of the microphone module and the third ground pattern are formed in a manner that is equal to or less than a predetermined gap.

11. An earbud comprising:

a housing having a main body portion in which a speaker port is provided and a stalk extending from the main body portion;

an antenna structure arranged within the stalk and radiating a wireless signal out of the earbud; and a printed circuit board (PCB) configured to be electrically connected to the antenna structure, wherein the antenna structure comprises:

a feeder configured to be connected to a signal pattern on the PCB and to transfer a signal;

an antenna pattern formed to a first length in such a manner as to be connected to the feeder and to radiate the signal; and a ground pattern formed in such a manner as to be connected to a ground pattern on the PCB and to surround the antenna pattern on one side and the other side of the antenna pattern, wherein the ground pattern comprises:

a first ground pattern formed in such a manner as to be connected to the ground pattern on the PCB and to have a second length on one side of the antenna pattern;

a second ground pattern formed in such a manner as to be connected to the first ground pattern and to have a third length; and a third ground pattern formed in such a manner as to be connected to the second ground pattern and to have a fourth length on the other side of the antenna pattern, wherein the antenna structure operates as a radiator in the 2.4 GHz band and the 5 GHz band, and is formed to fall within a predetermined range of lengths where the median corresponds to half a wavelength in the 2.4 GHz band by the total length resulting from the sum of the first length of the antenna pattern, the second length of the first ground pattern, a connection length of the second ground pattern, and the third length of the third ground pattern.

12. The earbud of claim 11, wherein overlapping regions of the antenna pattern and the third ground pattern are formed in such a manner that lengths thereof range from 1 mm to 5 mm, and wherein the antenna pattern is formed in such a manner that the first length thereof is 1.0 mm or greater, the first ground pattern is formed in such a manner that the second length thereof is 3.0 mm or greater, the second ground pattern is formed in such a manner that the connection length thereof is 0.5 mm or greater, and the third ground pattern is formed in such a manner that the third length thereof is 1.0 mm or greater.

13. The earbud of claim 12, wherein the overlapping region is formed in such a manner that a length thereof falls within a first predetermined range of lengths having a corresponding median of 1.5 mm, the antenna pattern is formed in such a manner that the first length thereof falls within a second predetermined range of lengths having a corresponding median of 7.4 mm, the first ground pattern is formed in such a manner that the second length thereof falls within a third predetermined range of lengths having a corresponding median of 13.5 mm, the second ground pattern is formed in such a manner that the connection length thereof falls within a fourth predetermined range of lengths having a corresponding median of 4.5 mm, and the third ground pattern is formed in such a manner that the third length thereof falls within a fifth predetermined range of lengths having a corresponding median is 8.6 mm.

14. The earbud of claim 12, wherein the overlapping region is formed in such a manner that a length thereof falls within a first predetermined range of lengths having a corresponding median is 4.0 mm, the antenna pattern is formed in such a manner that the first length thereof falls within a second predetermined range of lengths having a corresponding median is 6.0 mm, the first ground pattern is formed in such a manner that the second length thereof falls within a third predetermined range of lengths having a corresponding median is 7.0 mm, the second ground pattern is formed in such a manner that the connection length thereof falls within a fourth predetermined range of lengths having a corresponding median is 4.5 mm, and the third ground pattern is formed in such a manner that the third length thereof falls within a fifth predetermined range of lengths having a corresponding median is 6.0 mm.

15. An electronic device comprising:

a dielectric housing including a main body portion in which a port is provided and a protruding portion extending from the main body portion; and an antenna module arranged within the protruding portion and radiating a wireless signal out of the electronic device, wherein the antenna module comprises:

a feeder configured to be connected to a signal pattern on a circuit structure arranged within the main body portion and to transfer a signal;

a radiator pattern formed to a first length in such a manner as to be connected to the feeder and to radiate the signal; and a ground pattern formed in such a manner as to be connected to a ground pattern on the circuit structure and to surround the radiator pattern on one side and the other side of the radiator pattern, wherein the radiator pattern is formed on a first flexible printed circuit board (FPCB) that is connected to a first surface of the circuit structure, wherein the ground pattern is formed on a second FPCB that is connected to a second surface facing the first surface of the circuit structure, and wherein the second FPCB comprises:

a first region attached to the second surface of the circuit structure; and a second region formed to surround the radiator pattern and forming a radiation region by being coupling-combined with the radiator pattern.

16. The electronic device of claim 15, wherein the circuit structure is embodied as a printed circuit board (PCB) configured to be electrically connected to the antenna module, and wherein the ground pattern comprises:

a first ground pattern formed in such a manner as to be connected to a ground pattern on the PCB and to have a second length on one side of the radiator pattern;

a second ground pattern formed in such a manner as to be connected to the first ground pattern and to have a third length; and a third ground pattern formed in such a manner as to be connected to the second ground pattern and to have a fourth length on the other side of the radiator pattern.

17. The electronic device of claim 16, wherein the second ground pattern is formed perpendicularly to the first ground pattern and is arranged in parallel to the feeder, wherein the third ground pattern is formed perpendicularly to the second ground pattern and is arranged in parallel to the radiator pattern, and wherein the third ground pattern forms an overlapping region that overlaps with the radiator pattern over a predetermined length along one axial direction on the other side of the radiator pattern.

18. The electronic device of claim 15, further comprising:

a radio frequency (RF) circuit operatively coupled to the antenna module and transferring a wireless signal in a specific frequency band to the antenna module; and a processor configured to be operatively coupled to the RF circuit and to control the RF circuit, wherein the processor controls the RF circuit in such a manner that a first wireless signal in a first frequency band is received through the antenna module, and, when signal quality of the first wireless signal is determined as being at or below a threshold value, the processor controls the RF circuit in such a manner that a second wireless signal in a second frequency band broader than the first frequency band is received from a host device through the antenna module.

* * * * *